(12) United States Patent
Choi et al.

(10) Patent No.: US 10,930,630 B2
(45) Date of Patent: Feb. 23, 2021

(54) BACKLIGHT UNIT AND DISPLAY DEVICE INCLUDING THE SAME

(71) Applicant: Samsung Display Co., Ltd., Yongin-si (KR)

(72) Inventors: Min Soo Choi, Hwaseong-si (KR); Jun Pyo Lee, Asan-si (KR); Jin Ho Park, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/653,923

(22) Filed: Oct. 15, 2019

(65) Prior Publication Data

US 2020/0286872 A1   Sep. 10, 2020

(30) Foreign Application Priority Data

Mar. 5, 2019   (KR) .................. 10-2019-0025136

(51) Int. Cl.
*H01L 25/16*   (2006.01)
*G02F 1/13357*   (2006.01)

(52) U.S. Cl.
CPC ...... *H01L 25/167* (2013.01); *G02F 1/133603* (2013.01); *G02F 2001/133628* (2013.01)

(58) Field of Classification Search
None
See application file for complete search history.

(56) References Cited

U.S. PATENT DOCUMENTS

| 7,525,191 | B2 | 4/2009 | Nakazato et al. |
| 9,853,189 | B2 | 12/2017 | Song et al. |
| 10,133,426 | B2 | 11/2018 | Den Boer et al. |
| 2015/0289358 | A1* | 10/2015 | Park ............... G02B 6/0073 349/65 |
| 2015/0359056 | A1 | 12/2015 | Song et al. |
| 2016/0330838 | A1* | 11/2016 | Park ............... G02F 1/133608 |
| 2018/0182746 | A1* | 6/2018 | Bibl ................ H01L 33/08 |
| 2018/0237337 | A1 | 8/2018 | Couillard et al. |

FOREIGN PATENT DOCUMENTS

| JP | 2006-294782 | 10/2006 |
| KR | 10-1736615 | 5/2017 |
| KR | 10-2018-0074664 | 7/2018 |

* cited by examiner

*Primary Examiner* — J. E. Schoenholtz
(74) *Attorney, Agent, or Firm* — Kile Park Reed & Houtteman PLLC

(57) ABSTRACT

A backlight unit and a display device including the same are provided. The backlight unit includes a first substrate on which at least one transistor is disposed; a second substrate facing the first substrate; a heat dissipation sheet which is disposed on the second substrate and at least a part of which is in contact with the first substrate; and at least one light source disposed between the heat dissipation sheet and the first substrate and electrically connected to the transistor. The heat dissipation sheet includes a first region in contact with the first substrate and a second region separated from the first substrate, the second region being a region other than the first region.

20 Claims, 28 Drawing Sheets

100a: 110, 120, 130
500: 510, 521, 522, 530, 550, 561, 562, 581, 582

100a: 110, 120, 130
500: 510, 521, 522, 530, 550, 561, 562, 581, 582

100a: 110, 120, 130
500: 510, 521, 522, 530, 550, 561, 562, 581, 582

100a: 110, 120, 130
500: 510, 521, 522, 530, 550, 561, 562, 581, 582

100a: 110, 120, 130
500: 510, 521, 522, 530, 550, 561, 562, 581, 582

100a: 110, 120, 130
500: 510, 521, 522, 530, 550, 561, 562, 581, 582

100a: 110, 120, 130
500: 510, 521, 522, 530, 550, 561, 562, 581, 582

BACKLIGHT UNIT AND DISPLAY DEVICE INCLUDING THE SAME

CROSS-REFERENCE TO RELATED APPLICATION

This application claims priority from Korean Patent Application No. 10-2019-0025136, filed on Mar. 5, 2019, which is hereby incorporated by references for all purposes as if fully set forth herein.

BACKGROUND

Field

Exemplary embodiments of the invention relate to a backlight unit and a display device including the same, and more particularly, to a backlight unit including a heat dissipation sheet which emits heat generated by a light emitting element and a circuit element and a display device including the same.

Discussion of the Background

Display devices are becoming increasingly important with the development of multimedia. In response thereto, various types of display devices such as an organic light emitting display (OLED), a liquid crystal display (LCD), and the like have been used. Such display devices have been variously applied to various mobile electronic devices, for example, portable electronic devices such as a smart phone, a smart watch, and a tablet PC.

A liquid crystal display device includes a backlight unit and a display panel, and receives light from the backlight unit to display an image on the display panel. The backlight unit includes a light source and a light guide plate, and the light guide plate can guide a traveling direction of light emitted from the light source located at the side surface toward the display panel. Alternatively, the backlight unit may include a glass substrate rather than a light guide plate, and a light source located above the glass substrate. In this case, light emitted from the light source can travel directly toward the display panel.

The light source may be a cold cathode fluorescent lamp (CCFL), a light emitting diode (LED), or the like. The light source may be disposed on a printed circuit board to emit light, e.g., white light or blue light, of a specific wavelength band.

On the other hand, when the backlight unit includes a glass substrate and a light emitting diode as a light source, a circuit element may be mounted on the glass substrate, and the light emitting diode may be disposed thereon to transmit light to the display panel. In this case, heat is generated as the circuit element and the light emitting diode are driven. However, since the glass substrate has low thermal conductivity, the heat may not be smoothly discharged to the outside, which is problematic.

The above information disclosed in this Background section is only for understanding of the background of the inventive concepts, and, therefore, it may contain information that does not constitute prior art.

SUMMARY

Exemplary embodiments of the invention provide a backlight unit including a heat dissipation sheet which emits heat generated by a light source and a circuit element.

Exemplary embodiments of the invention also provide a display device including the backlight unit with improved heat dissipation efficiency.

Additional features of the inventive concepts will be set forth in the description which follows, and in part will be apparent from the description, or may be learned by practice of the inventive concepts.

An exemplary embodiment of the invention provides a backlight unit including a first substrate on which at least one transistor is disposed, a second substrate facing the first substrate, a heat dissipation sheet which is disposed on the second substrate and at least a part of which is in contact with the first substrate, and at least one light source disposed between the heat dissipation sheet and the first substrate and electrically connected to the transistor. The heat dissipation sheet includes a first region in contact with the first substrate and a second region separated from the first substrate, the second region being a region other than the first region.

An upper surface of the heat dissipation sheet may have a first surface located in the first region and a second surface located in the second region and recessed to be separated from the first substrate; the transistor may be disposed in contact with the first surface; and the light source may be disposed between the second surface and the first substrate.

Thermal conductivity of the heat dissipation sheet may be a larger value than thermal conductivity of the first substrate, and heat generated by the light source and the transistor may be transferred to the heat dissipation sheet.

The second surface may have a curved shape at least in a partial region thereof.

The second surface may include an inclined surface formed in at least a partial region thereof, and a flat surface substantially parallel to the first substrate.

At least a partial region of the second surface may be in contact with a region of the light source facing the heat dissipation sheet.

At least a portion of light emitted from the light source may travel toward the first substrate.

The backlight unit may further include a reflective layer disposed between the light source and the second surface. At least a portion of the light emitted from the light source may travel toward the reflective layer.

The first substrate may further include a light blocking film disposed between the transistor and the first substrate, and the light blocking film may include at least one opening disposed such that at least a part thereof overlaps the light source.

At least a portion of the light emitted from the light source may travel to the first substrate through the opening.

The backlight unit may further include an optical sheet disposed between the light source and the first substrate.

A refractive index of the optical sheet may have a value between a refractive index of the light source and a refractive index of the first substrate.

The optical sheet may further include wavelength conversion particles which convert a central wavelength band of light incident from the light source.

Another exemplary embodiment of the invention provides a backlight unit including a glass substrate on which a circuit element layer including at least one transistor is mounted; a heat dissipation substrate which is disposed to face the glass substrate and at least a part of which is in contact with the glass substrate; and at least one light emitting diode disposed on the circuit element layer and electrically connected to the transistor. The heat dissipation substrate includes a first region in contact with the glass substrate and a second region separated from the glass substrate, the second region being a region other than the first region.

Thermal conductivity of the heat dissipation substrate may be larger than thermal conductivity of the glass substrate.

The transistor may be disposed to overlap the first region and be in contact with the heat dissipation substrate, and the light emitting diode may be disposed to overlap the second region and may be disposed between the glass substrate and the heat dissipation substrate.

At least a partial region of the heat dissipation substrate may be in contact with the light emitting diode.

Another exemplary embodiment of the invention provides a display device including a backlight unit; and a display panel disposed above the backlight unit. The backlight unit includes: a first substrate; a second substrate facing the first substrate; a heat dissipation sheet which is disposed on the second substrate and at least a part of which is in contact with the first substrate; and at least one light source disposed between the heat dissipation sheet and the first substrate. The heat dissipation sheet includes a first region in contact with the first substrate and a second region separated from the first substrate, the second region being a region other than the first region. The light source is disposed in the second region in which the heat dissipation sheet and the first substrate are separated from each other.

Thermal conductivity of the heat dissipation sheet may be larger than thermal conductivity of the first substrate.

The first substrate may further include a circuit element layer containing at least one transistor, and the transistor may be disposed to be in contact with the heat dissipation sheet in the first region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
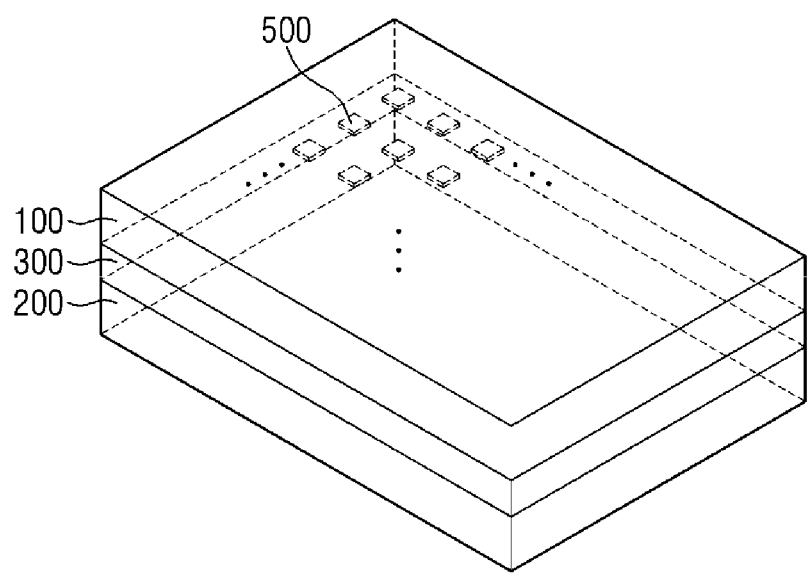
FIG. 1 is a schematic perspective view of a backlight unit according to an exemplary embodiment.
Figure 1:
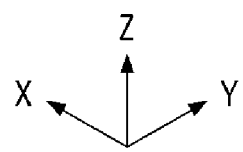

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described with reference to the accompanying drawings.

Figure 2:
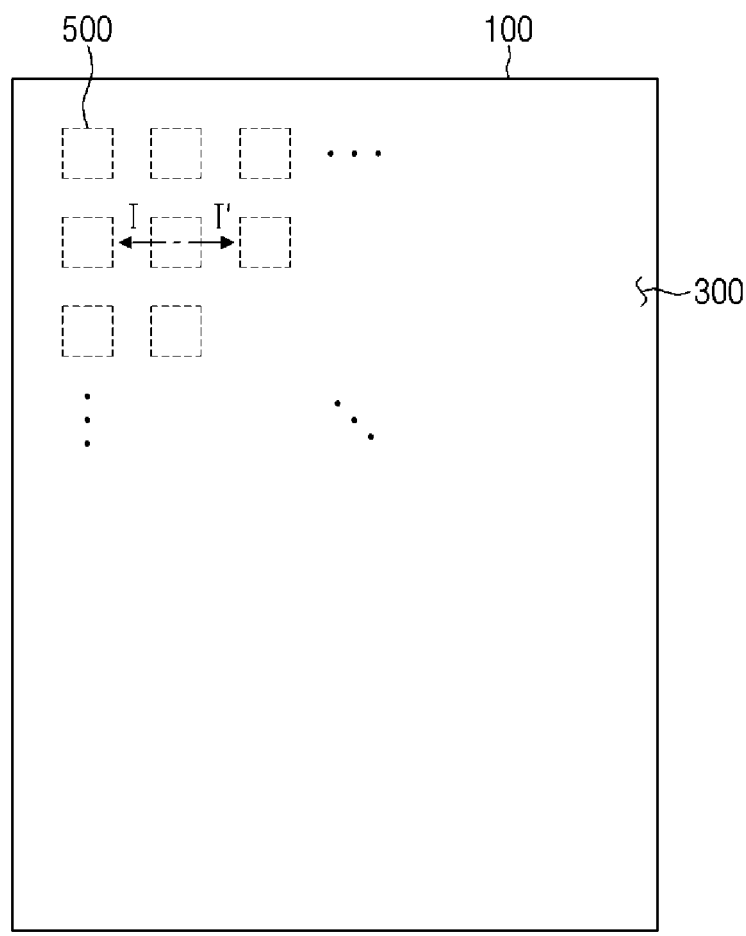
FIG. 2 is a plan view of a backlight unit according to an exemplary embodiment.

FIG. 1 is a schematic perspective view of a backlight unit according to an exemplary embodiment. FIG. 2 is a plan view of a backlight unit according to an exemplary embodiment.

Referring to FIGS. 1 and 2, a backlight unit 10 includes a first substrate 100, a second substrate 200, a plurality of light sources 500 and a heat dissipation sheet 300. The backlight unit 10 according to an exemplary embodiment may include the first substrate 100 and the second substrate 200 facing each other, the plurality of light sources 500 disposed between the first substrate 100 and the second substrate 200, and the heat dissipation sheet 300.

The first substrate 100 forms an upper surface of the backlight unit 10. The first substrate 100 may be disposed to cover other members, e.g., the second substrate 200 and the heat dissipation sheet 300, of the backlight unit 10. The first substrate 100 may perform a function of protecting the members. The shape of the first substrate 100 may be rectangular in a plan view. As shown in the figure, the first substrate 100 may have an angular corner portion where the edges meet each other, but the inventive concepts are not limited thereto. The corner portion may have a rounded shape with a predetermined curvature.

The first substrate 100 includes upper and lower surfaces in a third direction (Z-axis direction), and the light sources 500 to be described later are disposed on the lower surface of the first substrate 100. In one exemplary embodiment, the plurality of light sources 500 may be disposed on one surface (e.g., the lower surface facing the second substrate 200) of the first substrate 100, and the lower surface of the first substrate 100 may perform a function of supporting the plurality of light sources 500. The light sources 500 may emit light of a specific wavelength band, and at least a portion of the light may travel toward the upper surface of the first substrate 100. Accordingly, the upper surface of the first substrate 100 may form a light exit surface through which light emitted from the backlight unit 10 is emitted. However, the inventive concepts are not limited thereto, and at least a portion of the light emitted from the light sources 500 may travel in a direction opposite to the first substrate 100.

In an exemplary embodiment, the first substrate 100 may include a transparent material to transmit light emitted from the light sources 500. For example, the first substrate 100 may be a glass substrate. When the first substrate 100 is a glass substrate, the lower surface of the glass substrate may be a surface on which a circuit element layer and the light sources 500 are disposed, and the upper surface of the glass substrate may be a light exit surface through which the light emitted from the light sources 500 travels. The backlight unit 10 according to an exemplary embodiment may emit light toward the first substrate 100 on which the light sources 500 are disposed.

Although not shown in FIGS. 1 and 2, a circuit element layer including at least one transistor may be disposed on the one surface of the first substrate 100. The circuit element layer may include at least one transistor for driving the light sources 500, and the light sources 500 may be disposed on the circuit element layer and electrically connected to the transistor. That is, the circuit element layer and the light sources 500 (disposed on the circuit element layer) may be disposed on the lower surface of the first substrate 100, and the light sources 500 may receive electric signals from the circuit element layer and emit light of a specific wavelength band. A more detailed description thereof will be described later.

The second substrate 200 is disposed to face the first substrate 100 and forms the lower surface of the backlight unit 10. The second substrate 200 may perform a function of supporting a plurality of members (e.g., the first substrate 100, the heat dissipation sheet 300 and the like) of the backlight unit 10. The second substrate 200 may have substantially the same shape as the first substrate 100, but the inventive concepts are not limited thereto.

Further, in an exemplary embodiment, the second substrate 200 may include a material having high thermal conductivity to emit the heat generated from the light sources 500 and the circuit element layer disposed on the lower surface of the first substrate 100 from the backlight unit 10. That is, the second substrate 200 may function as a heat sink of the backlight unit 10. When the first substrate 100 is a glass substrate having low thermal conductivity, the heat generated from the light sources 500 and the circuit element layer may not be smoothly emitted through the first substrate 100. The backlight unit 10 according to an exemplary embodiment may include the heat dissipation sheet 300, to be described later, to transmit the heat to the second substrate 200 and smoothly emit the heat. The second substrate 200 may provide a path for emitting the heat generated from the light sources 500 and the circuit element layer.

The light sources 500 may be disposed on one surface of the first substrate 100 facing the second substrate 200, i.e., on the lower surface of the first substrate 100, as shown in FIG. 1. The plurality of light sources 500 may be separated from each other on the lower surface of the first substrate 100. As shown in FIG. 2, the light sources 500 may be arranged in a plurality of rows and a plurality of columns on the lower surface of the first substrate 100. Although it is illustrated in the drawings that one light source 500 is disposed within a predetermined region defined on the lower surface of the first substrate 100, the inventive concepts are not limited thereto. One or more light sources 500 may be disposed in the region, and the above-described transistor of the circuit element layer may simultaneously transmit electric signals to the plurality of light sources 500 disposed in the region.

The light sources 500 may emit light of a specific wavelength band. In an exemplary embodiment, the light source 500 may be a light emitting diode (LED) or a light emitting diode (LED) chip, and the light of the light emitting diode (LED) may be emitted from the backlight unit 10 through the first substrate 100. A specific structure of the light source 500 will be described later.

The light sources 500 may receive electric signals from the circuit element layer and emit light of a specific wavelength band. The light sources 500 and the circuit element layer may generate heat according to the driving of the backlight unit 10, and the light sources 500 and the circuit element layer may be damaged or defective if the heat is not smoothly emitted. Particularly, when the first substrate 100 is a glass substrate as described above, heat dissipation efficiency of the heat generated by the light sources 500 and the circuit element layer may be low. The backlight unit 10 according to an exemplary embodiment may include the heat dissipation sheet 300 disposed between the first substrate 100 and the second substrate 200 to improve heat dissipation efficiency of the heat.

The heat dissipation sheet 300 is disposed on the second substrate 200. The heat dissipation sheet 300 has substantially the same shape as the second substrate 200 and is disposed between the second substrate 200 and the first substrate 100 to partially cover the light sources 500. In one exemplary embodiment, at least a portion of the heat dissipation sheet 300 is in contact with the lower surface of the first substrate 100, and the other portion of the heat dissipation sheet 300 is disposed between the light sources 500 and the second substrate 200. The heat dissipation sheet 300 may be in contact with the first substrate 100 in a region where the transistor of the circuit element layer is located, and is disposed so as to surround the light sources 500, so that the heat generated therefrom can be smoothly transferred to the second substrate 200.

In an exemplary embodiment, the heat dissipation sheet 300 may include a material having higher thermal conductivity than the first substrate 100. Most of the heat generated by the light sources 500 and the circuit element layer is transferred to the second substrate 200 by the heat dissipation sheet 300, and the second substrate 200 may emit the heat from the backlight unit 10. The backlight unit 10 according to an exemplary embodiment may include the heat dissipation sheet 300 to improve heat dissipation efficiency.

A detailed description of the structure of the backlight unit 10 will be given later with reference to other drawings.

Figure 3:
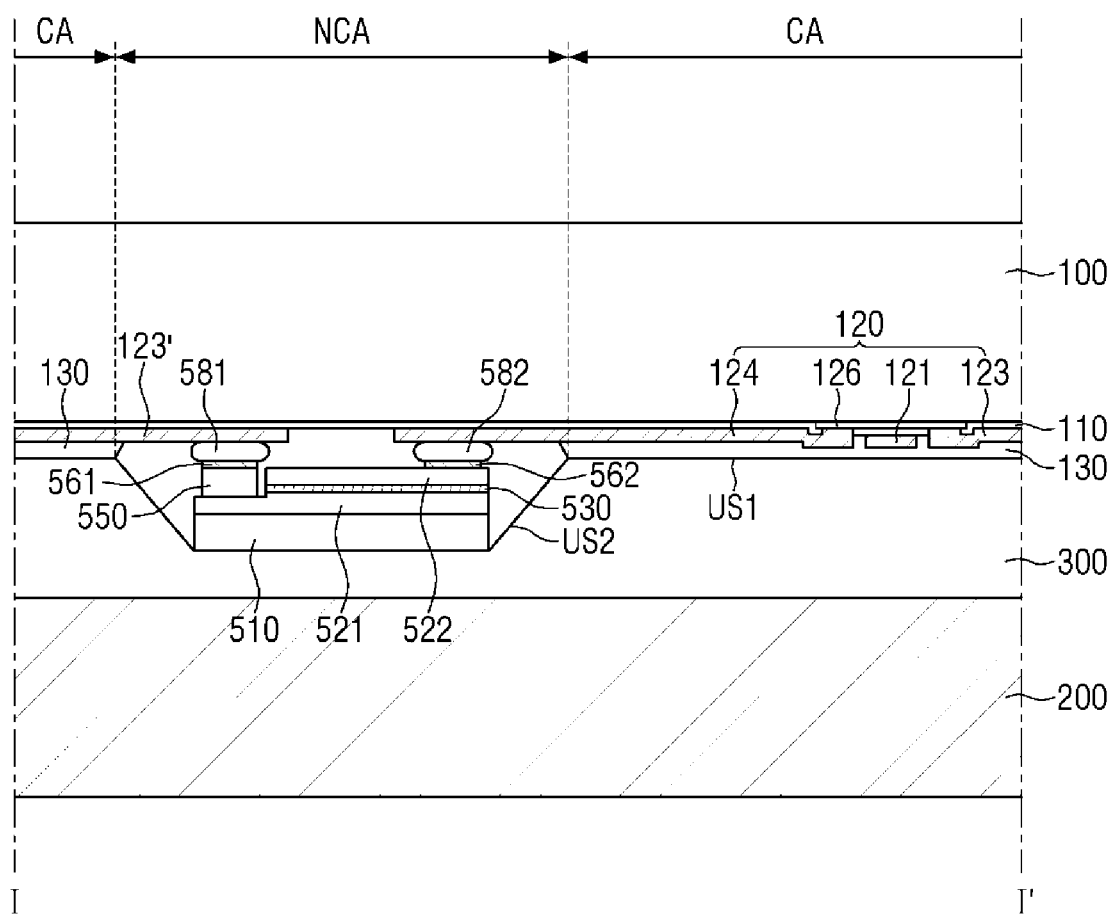
FIG. 3 is a cross-sectional view taken along line I-I' of FIG. 2.
Figure 3:
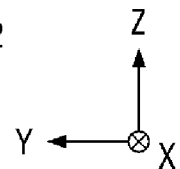

FIG. 3 is a cross-sectional view taken along line I-I' of FIG. 2. FIG. 3 shows a cross section of one light source 500 in the backlight unit 10.

Referring to FIG. 3, the backlight unit 10 according to an exemplary embodiment may include the first substrate 100 and the second substrate 200 facing each other, the plurality of light sources 500 arranged on one surface of the first substrate 100 facing the second substrate 200, and the heat dissipation sheet 300 disposed between the first substrate 100 and the second substrate 200 to surround the light sources 500.

The first substrate 100 includes a lower surface which is one surface facing the second substrate 200, and an upper surface which is the other surface opposite to the lower surface. A circuit element layer 100a including at least one transistor 120 may be disposed on the lower surface of the first substrate 100, and at least one light source 500 may be disposed on the circuit element layer 100a. Although only one light source 500 and one transistor 120 are shown in FIG. 3, a greater number of transistors 120 and light sources 500 may be disposed on the lower surface of the first substrate 100.

The circuit element layer 100a may include the transistor 120 and a plurality of insulating layers 110 and 130. The transistor 120 may include an active layer 126, a gate electrode 121, a source electrode 123, and a drain electrode 124. The insulating layers 110 and 130 include a first insulating layer 110 and a second insulating layer 130.

The active layer 126 of the transistor 120 is disposed on the lower surface of the first substrate 100. The circuit element layer 100a may further include a buffer layer (not shown) disposed between the active layer 126 of the transistor 120 and the first substrate. Accordingly, the active layer 126 may be disposed on the buffer layer. The active layer 126 may be a semiconductor layer including an oxide semiconductor, silicon, or the like, but is not limited thereto.

Although not shown in FIG. 3, the active layer 126 may include a conductor region and a channel region. A region where the gate electrode 121 and the active layer 126 overlap each other may be a channel region, and the other region may be a conductor region which is partially doped with impurities. The source electrode 123 and the drain electrode 124 may be in contact with the conductor region.

The first insulating layer 110 is disposed on the active layer 126. The source electrode 123, the drain electrode 124 and the gate electrode 121 are disposed on the first insulating layer 110. The active layer 126 may overlap the gate electrode 121 with the first insulating layer 110 interposed therebetween to form the channel region described above. The first insulating layer 110 may be disposed entirely on the lower surface of the first substrate 100.

A contact hole may be formed in the first insulating layer 110 to expose a portion of the active layer 126 through the first insulating layer 110. The source electrode 123 and the drain electrode 124 disposed on the first insulating layer 110 may be in contact with the conductor region of the active layer 126 through the contact hole. The source electrode 123 and the drain electrode 124 may extend in one direction to a region where the light source 500 is disposed. The source electrode 123 and the drain electrode 124 may be in contact with conductive balls 581 and 582 (to be described later) of the light source 500 to transmit an electric signal to the light source 500. A region where the source electrode 123 and the drain electrode 124 are in contact with the conductive balls 581 and 582 of the light source 500 may have an expanded planar area. In other words, a region connected to and extending from the active layer 126 of the transistor 120 may have a linear shape having a relatively narrow width, and a region in contact with the conductive balls 581 and 582 may have a shape such as a circle, a rectangle or the like, with an expanded width or area. However, the inventive concepts are not limited thereto.

Further, the source electrode 123 and the drain electrode 124 may extend in the one direction, and the source electrode 123' and the drain electrode of different transistors 120 may terminate to be separated from each other. The light source 500 may be disposed in the region where the source electrode 123' and the drain electrode 124 terminate to be separated from each other, and the light emitted from the light source 500 may travel to the separation space.

The second insulating layer 130 is disposed on the gate electrode 121, the source electrode 123, and the drain electrode 124. The second insulating layer 130 may be disposed entirely on the first substrate 100 similarly to the first insulating layer 110, and may be disposed to expose a part of the first insulating layer 110, the source electrode 123, and the drain electrode 124. The second insulating layer 130 may cover the source electrode 123 and the drain electrode 124 to insulate them, and may expose a region electrically connected to the light source 500. Further, the second insulating layer 130 may insulate the heat dissipation sheet 300, to be described later, from the source electrode 123 and the drain electrode 124.

Although it is illustrated in FIG. 3 that the transistor 120 of the circuit element layer 100a has a top-gate structure in which the gate electrode 121 is disposed on the upper surface of the active layer 126, but the inventive concepts are not limited thereto. Further, the circuit element layer 100a may include more elements other than the transistor 120 and the insulating layers 110 and 130.

The light source 500 may be disposed on the circuit element layer 100a and may be connected to the source electrode 123 and the drain electrode 124 of the transistor 120. One light source 500 may be connected to different transistors 120 and may be connected to the source electrode 123 and the drain electrode 124 of each transistor 120. That is, one transistor 120 may be connected to two different light sources 500. However, the inventive concepts are not limited thereto, and the number of the light sources 500 connected to one transistor 120 may vary according to the number of the light sources 500 disposed in a predetermined region on the first substrate 100, as described above.

The light source 500 is disposed on the circuit element layer 100a and connected to the source electrode 123 and the drain electrode 124 of the transistor 120. The light source 500 may emit light of a specific wavelength band when an electric signal is applied from the transistor 120. In an exemplary embodiment, the light source 500 may be a light emitting diode (LED) including a semiconductor crystal.

As shown in FIG. 3, the light source 500 includes a base substrate 510, a first conductivity type semiconductor 521, a second conductivity type semiconductor 522, an active material layer 530, a plurality of electrode layers 561 and 562, and conductive balls 581 and 582. The electric signal transmitted from the transistor 120 may be transmitted to the active material layer 530 through the first conductivity type semiconductor 521 and the second conductivity type semiconductor 522, and the active material layer 530 may emit light of a specific wavelength band.

Specifically, the base substrate 510 may support the semiconductor crystal of the light source 500. In an exemplary embodiment, the base substrate 510 may include a sapphire substrate ($Al_2O_3$) and a transparent substrate such as glass. However, the inventive concepts are not limited thereto, and it may be formed of a conductive substrate such as GaN, SiC, ZnO, Si, GaP and GaAs.

The first conductivity type semiconductor 521 is disposed on the base substrate 510. The first conductivity type semiconductor 521 may be an n-type semiconductor layer. For example, when the light source 500 emits light of a blue wavelength band, the first conductivity type semiconductor 521 may be a semiconductor material having a chemical formula of InxAlyGa1-x-yN ($0 \leq x \leq 1$, $0 \leq y \leq 1$, $0 \leq x+y \leq 1$). For example, it may be any one or more of n-type doped InAlGaN, GaN, AlGaN, InGaN, AlN and InN. The first conductivity type semiconductor 521 may be doped with a first conductive dopant. For example, the first conductive dopant may be Si, Ge, Sn, or the like.

The first conductivity type semiconductor 521 may have a shape in which at least a part of one surface is recessed inward. An auxiliary layer 550 may be disposed on an upper surface formed by recessing the one surface. The first electrode layer 561, to be described later, may be disposed on the auxiliary layer 550, and the auxiliary layer 550 may function to compensate a step between the second electrode layer 562 and the first electrode layer 561 disposed on the semiconductor second conductivity type semiconductor 522. The auxiliary layer 550 may include a conductive material or a semiconductor material and may transmit the electric signal applied to the first electrode layer 561 to the first conductivity type semiconductor 521.

The second conductivity type semiconductor 522 may be a p-type semiconductor layer. For example, when the light source 500 emits light of a blue wavelength band, the second conductivity type semiconductor 522 may be a semiconductor material having a chemical formula of $In_xAl_yGa_{1-x-y}N$ ($0 \leq x \leq 1$, $0 \leq y \leq 1$, $0 \leq x+y \leq 1$). For example, it may be any one or more of p-type doped InAlGaN, GaN, AlGaN, InGaN, AlN and InN. The second conductivity type semiconductor 522 may be doped with a second conductive dopant. For example, the second conductive dopant may be Mg, Zn, Ca, Se, Ba, or the like.

The active material layer 530 is disposed between the first conductivity type semiconductor 521 and the second conductivity type semiconductor 522. The active material layer 530 may include a material having a single or multiple quantum well structure. When the active material layer 530 includes a material having a multiple quantum well structure, a plurality of quantum layers and well layers may be stacked alternately. The active material layer 530 may emit light by coupling of electron-hole pairs according to an electric signal applied through the first conductivity type semiconductor 521 and the second conductivity type semiconductor 522. For example, when the active material layer 530 emits light of a blue wavelength band, it may include a material such as AlGaN or AlInGaN. In particular, when the active material layer 530 has a multiple quantum well structure in which quantum layers and well layers may be stacked alternately, the quantum layer may include a material such as AlGaN or AlInGaN, and the well layer may include a material such as GaN or AlGaN. However, the inventive concepts are not limited thereto, and the active material layer 530 may include other Group III to V semiconductor materials according to the wavelength band of the emitted light.

The plurality of electrode layers 561 and 562 are disposed on the auxiliary layer 550 and the second conductivity type semiconductor 522, respectively. The first electrode layer 561 is disposed on the auxiliary layer 550 and the second electrode layer 562 is disposed on the second conductivity type semiconductor 522. The conductive balls 581 and 582, such as the first conductive ball 581 and the second conductive ball 582, are disposed on the first electrode layer 561 and the second electrode layer 562, respectively. The electrode layers 561 and 562 and the conductive balls 581 and 582 may include a conductive material to transmit an electric signal transmitted from the transistor 120 to the first conductivity type semiconductor 521 and the second conductivity type semiconductor 522. The light source 500 may be electrically connected to the source electrode 123 and the drain electrode 124 of the transistor 120 through the conductive balls 581 and 582. However, the structure of the light source 500 is not limited thereto and may have other structures depending on the case.

The heat dissipation sheet 300 may transfer the heat generated by driving the transistor 120 of the circuit element layer 100a and the light source 500 to the second substrate 200. In an exemplary embodiment, the heat dissipation sheet 300 may include a material having higher thermal conductivity than the first substrate 100. For example, the heat dissipation sheet 300 may include a metal, such as tungsten, aluminum, copper, or the like. The heat dissipation sheet 300 may be disposed adjacent to the transistor 120 and the light source 500, and may include a material having high thermal conductivity to smoothly discharge the heat generated therefrom. In particular, at least a part of the heat dissipation sheet 300 may be in contact with the circuit element layer 100a in order to efficiently discharge the heat generated by the transistor 120 of the circuit element layer 100a.

According to one exemplary embodiment, a first region CA where at least a part of the heat dissipation sheet 300 is in contact with one surface (e.g., the lower surface on which the circuit element layer 100a is disposed) of the first substrate 100 and a second region NCA which is a region other than the first region CA and separated from the lower surface of the first substrate 100 may be defined in the heat dissipation sheet 300. The upper surface of the heat dissipation sheet 300 may include a first surface US1 located in the first region CA and a second surface US2 located in the second region NCA.

The first surface US1 of the heat dissipation sheet 300 may be in contact with the circuit element layer 100a of the first substrate 100, i.e., the second insulating layer 130, to form a substantially flat surface. On the other hand, the second surface US2 may have a shape in which a partial region is recessed such that the heat dissipation sheet 300 and the first substrate 100 are separated from each other without being in contact with each other. Although it is illustrated in FIG. 3 that the second surface US2 includes a region inclined at a predetermined angle, but the present disclosure is not limited thereto. The second surface US2 may form a curved surface and may have a rounded shape.

The first surface US1 of the upper surface of the heat dissipation sheet 300 may be in contact with the first substrate 100 or the circuit element layer 100a. The transistor 120 of the circuit element layer 100a may be disposed in the first region CA where the first surface US1 is located. The heat generated by the transistor 120 may be efficiently transferred to the second substrate 200 through the heat dissipation sheet 300 in direct contact therewith. As described above, since the circuit element layer 100a includes the second insulating layer 130 disposed to cover the transistor 120, even if the heat dissipation sheet 300 including a metal material is in contact with the circuit element layer 100a, the source and drain electrodes 123 and 124 of the transistor 120 and the heat dissipation sheet 300 can be insulated from each other.

The transistor 120 may be disposed in a region where the source electrode 123 and the drain electrode 124 extend in one direction and the light source 500 is located as described above. In this case, the transistor 120 may be partially disposed in the second region NCA other than the first region CA. The source electrode 123 and the drain electrode 124 of the transistor 120 may be disposed such that at least a part thereof is separated from the heat dissipation sheet 300 and exposed in a direction toward the lower surface of the first substrate 100. However, the inventive concepts are not limited thereto.

The second surface US2 of the upper surface of the heat dissipation sheet 300 may be formed to be separated from the first substrate 100 or the circuit element layer 100a. The light source 500 may be disposed in a space formed between the second surface US2 of the heat dissipation sheet 300 and the first substrate 100 which are separated from each other. That is, the light source 500 may be disposed in the second region NCA where the second surface US2 of the heat dissipation sheet 300 is located on the circuit element layer 100a. The second surface US2 of the heat dissipation sheet 300 may be formed to substantially surround the light source 500 and may transfer the heat generated by the light source 500 to the second substrate 200.

The second surface US2 of the heat dissipation sheet 300 may be recessed to be separated from the first substrate 100. In one example, the second surface US2 may be configured such that at least a partial region forms a substantially flat surface and the other region forms an inclined surface connected to the first surface US1. Accordingly, the light source 500 may be disposed in a space formed between the first substrate 100 and the heat dissipation sheet 300 in the second region NCA where the second surface US2 of the heat dissipation sheet 300 is located. The second surface US2 may be disposed adjacent to the light source 500 to efficiently discharge the heat of the light source 500.

Further, in an exemplary embodiment, at least a part of the second surface US2 of the heat dissipation sheet 300 may be in contact with the light source 500. As shown in FIG. 3, a partial region, i.e., a substantially flat surface, of the second surface US2 is in contact with the base substrate base substrate 510 of the light source 500. In this case, the heat generated by the light source 500 can be smoothly transferred to the heat dissipation sheet 300 through the base substrate 510. However, the inventive concepts are not limited thereto, and the second surface US2 may have a rounded shape with a predetermined curvature, or the light source 500 may be disposed to be separated from the heat dissipation sheet 300 without being in contact with the heat dissipation sheet 300.

At least a portion of the light emitted by the light source 500 may be emitted from the backlight unit 10 toward the first substrate 100. In the region between the first substrate 100 and the light source 500, only the first insulating layer 110 may be disposed without the source electrode 123 or the drain electrode 124 of the circuit element layer 100a. As described above, the source electrode 123' and the drain electrode 124 of the different transistors 120 may terminate to be separated from each other, and at least a portion of the light emitted from the light source 500 may travel through the first substrate 100 without being blocked by the source electrode 123' or the drain electrode 124.

Further, the light source 500 and the transistor 120 are disposed in contact with or adjacent to the heat dissipation sheet 300. The heat generated by the light source 500 and the transistor 120 can be smoothly transferred to and discharged from the second substrate 200 through the heat dissipation sheet 300 including a material having high thermal conductivity.

Figure 4:
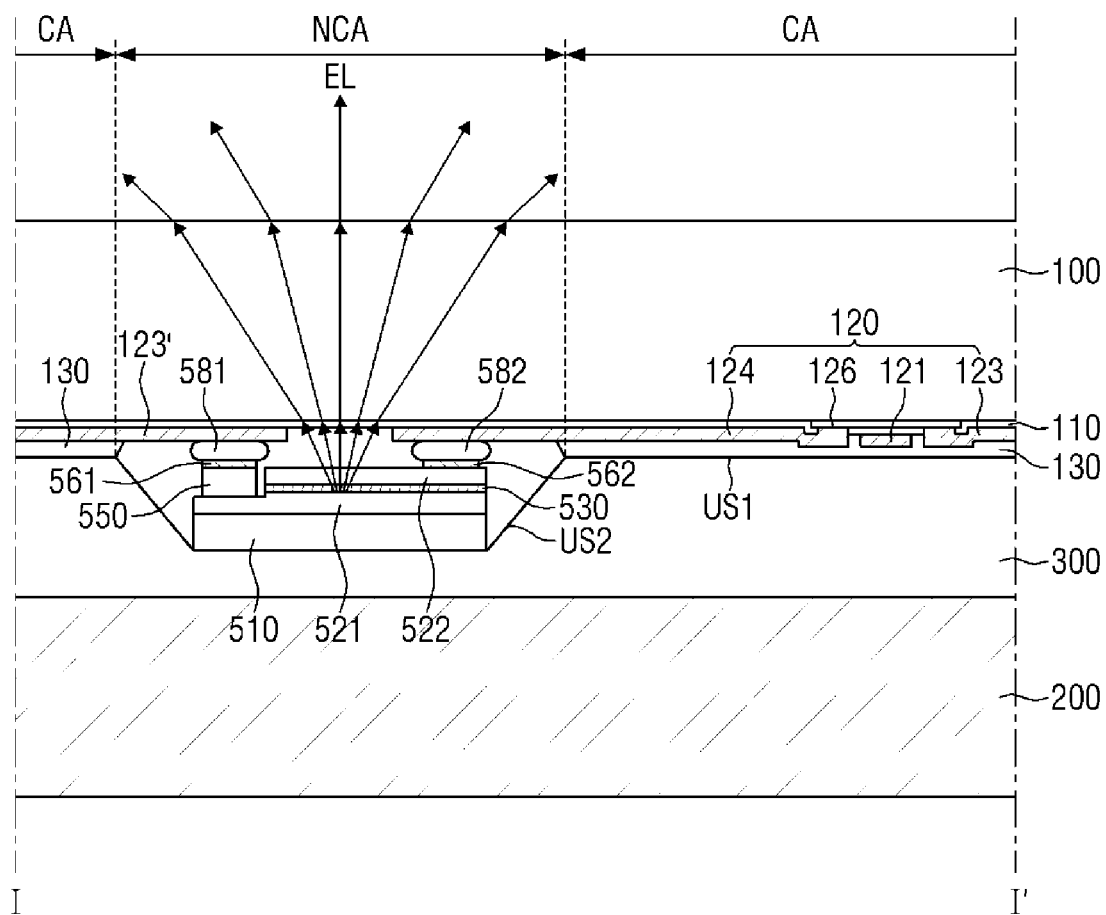
FIG. 4 is a schematic diagram illustrating a traveling direction of the light emitted from a light source according to an exemplary embodiment.
Figure 4:
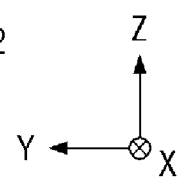
Figure 5:
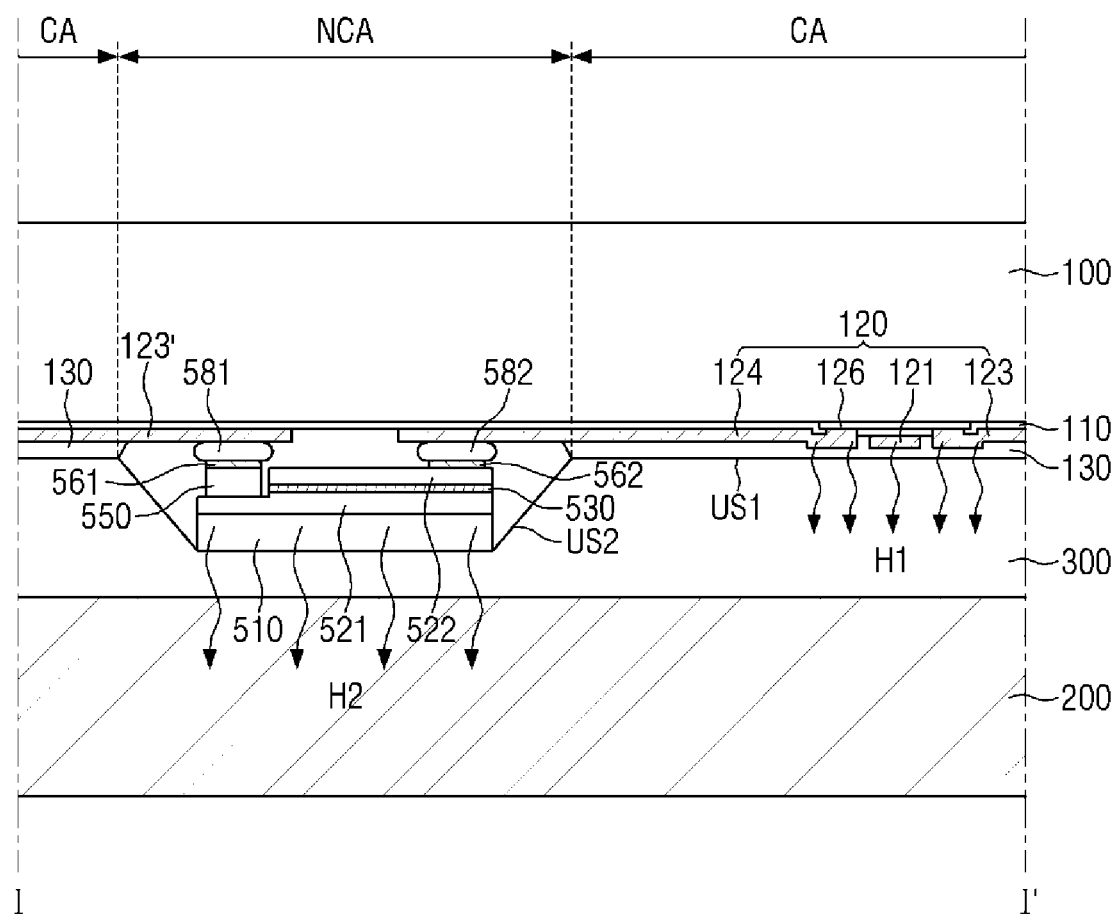
FIG. 5 is a schematic diagram illustrating a transfer direction of the heat generated by a light source according to an exemplary embodiment.
Figure 5:
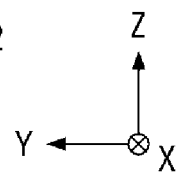

FIG. 4 is a schematic diagram illustrating a traveling direction of the light emitted from a light source according to an exemplary embodiment. FIG. 5 is a schematic diagram illustrating a transfer direction of the heat generated by a light source according to an exemplary embodiment.

First, referring to FIG. 4, the light source 500 may receive an electric signal from the transistor 120 and emit light EL having a specific wavelength band from the active material layer 530. In an exemplary embodiment, at least a portion of the light EL emitted from the light source 500 may travel toward the first substrate 100. FIG. 4 shows that the light EL is emitted in the third direction (Z-axis direction) from the active material layer 530 and directed toward the first substrate 100. In the circuit element layer 100a disposed between the first substrate 100 and the light source 500, the source electrode 123 of the transistor 120 and the drain electrode 124 of the other transistor are separated from each other, and the light EL of the light source 500 may travel to the separation space. As described above, the first substrate 100 may be a substrate including a transparent material, for example, a glass substrate, and the light EL emitted from the light source 500 may be emitted from the backlight unit 100 through the first substrate 100.

However, the inventive concepts are not limited thereto, and at least a portion of the light emitted from the light source 500 may travel, for example, toward the second surface US2 of the heat dissipation sheet 300, instead of a direction toward the first substrate 100. The backlight unit 10 according to an exemplary embodiment may further include a reflective layer 310 (see FIG. 6) disposed between the light source 500 and the heat dissipation sheet 300, and a portion of the light emitted from the light source 500 may be reflected by the reflective layer 310. A detailed description of the reflective layer 310 may refer to other drawings.

Next, referring to FIG. 5, the light source 500 and the transistor 120 of the circuit element layer 100a may generate heats H1 and H2 since they are driven by applying the electric signal. The transistor 120 is disposed in contact with the first substrate 100 and the first surface US1 of the heat dissipation sheet 300, but most of the heat H1 generated in the transistor 120 may be transferred to the heat dissipation sheet 300 having higher thermal conductivity. Since the light source 500 is separated from the first substrate 100 and may be in contact with the second surface US2 of the heat dissipation sheet 300, most of the heat H2 generated by the light source 500 may be transferred to the heat dissipation sheet 300.

FIG. 5 illustrates that the second surface US2 of the heat dissipation sheet 300 is in contact with the light source 500 and the heat H2 is transferred to the second surface US2 in contact. However, inventive concepts are not limited thereto, and the second surface US2 of the heat dissipation sheet 300 may be disposed so as to substantially surround the light source 500 so that the heat H2 of the light source 500 can be transferred to the second substrate 200 from the entire region of the second surface US2.

As described above, since the heat dissipation sheet 300 includes a material having higher thermal conductivity than the first substrate 100, the heats H1 and H2 generated in the transistor 120 and the light source 500 can be smoothly transferred to the second substrate 200. The second substrate 200 can discharge the heats H1 and H2 received from the heat dissipation sheet 300 to the outside of the backlight unit 10, thereby improving the heat dissipation efficiency of the backlight unit 10. The backlight unit 10 according to an exemplary embodiment includes the light source 500 and the transistor 120 disposed between the first substrate 100 and the heat dissipation sheet 300, and the traveling direction of the light EL emitted from the light source 500 may be opposite to the traveling direction of the heat H2 discharged from the light source 500.

The light emitted from the light source 500 does not necessarily travel toward the first substrate 100, and at least a portion of the light may travel toward the heat dissipation sheet 300 or in other directions. The backlight unit 10 may further include a reflective layer for reflecting the light toward the first substrate 100 to prevent loss of the light emitted from the light source 500.

Figure 6:
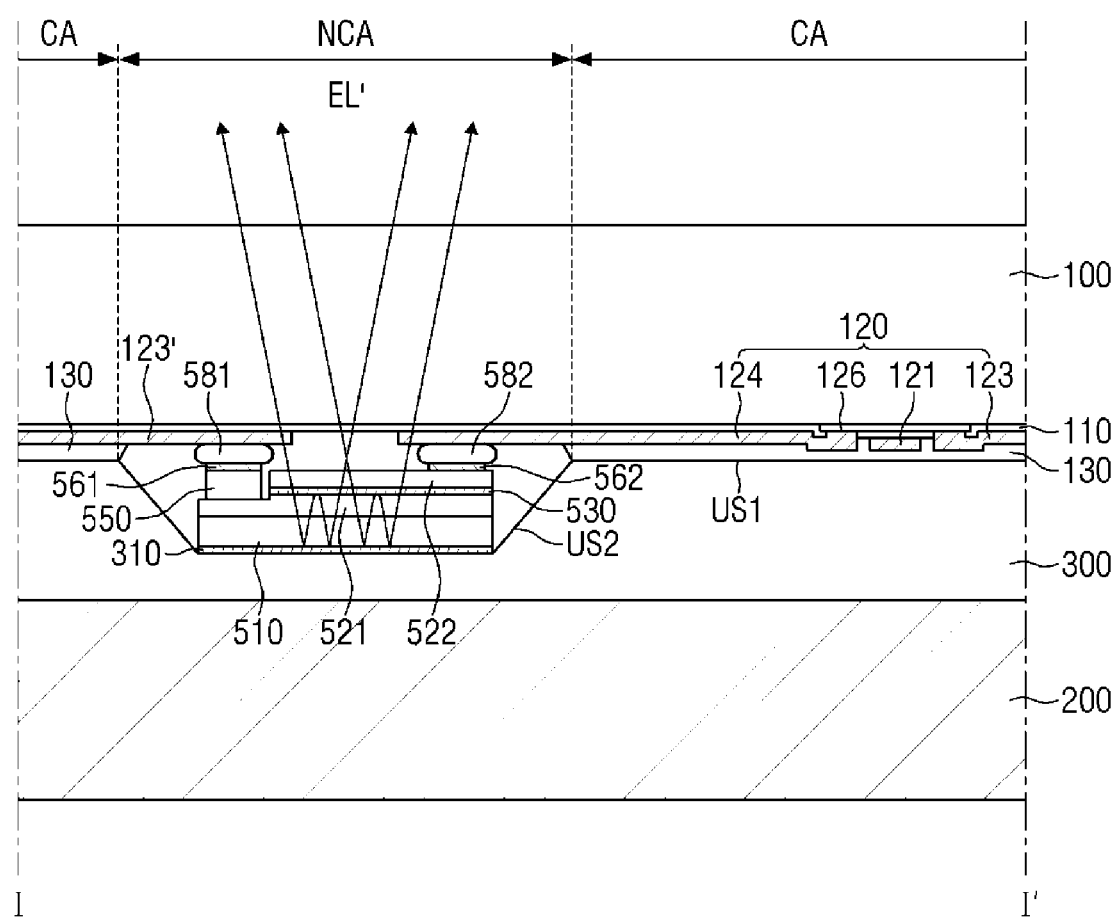
FIG. 6 is a partial cross-sectional view of a backlight unit according to another exemplary embodiment.
Figure 6:
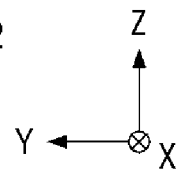

FIG. 6 is a partial cross-sectional view of a backlight unit according to another exemplary embodiment.

Referring to FIG. 6, the backlight unit 10 according to an exemplary embodiment may further include the reflective layer 310 disposed between the light source 500 and the heat dissipation sheet 300.

As described above, at least a portion of the light EL emitted from the light source 500 may travel, for example, toward the heat dissipation sheet 300, instead of a direction toward the first substrate 100. According to one exemplary embodiment, the reflective layer 310 may be further disposed between the light source 500 and the heat dissipation sheet 300, i.e., on at least a partial region on the second surface US2 of the heat dissipation sheet 300, so that the light traveling to the heat dissipation sheet 300 can be reflected to the first substrate 100.

FIG. 6 illustrates that the reflective layer 310 is disposed in a region where the light source 500 and the second surface US2 of the heat dissipation sheet 300 overlap each other. The light emitted from the active material layer 530 of the light source 500 may travel without directionality, and the reflective layer 310 may be disposed between the light source 500 and the second surface US2 to reflect light traveling in an opposite direction from the first substrate 100. However, the inventive concepts are not limited thereto, and the reflective layer 310 may be disposed to entirely cover the second surface US2.

The reflective layer 310 may include a material having high reflectivity. In an exemplary embodiment, the reflective layer 310 may include a material such as silver (Ag), copper (Cu), aluminum (Al), nickel (Ni), lanthanum (La), an alloy thereof, Indium Tin Oxide (ITO), Indium Zinc Oxide (IZO), Indium Tin Zinc Oxide (ITZO) and the like, but is not limited thereto.

As shown in FIG. 6, the light emitted from the light source 500 and directed toward the heat dissipation sheet 300 or the second surface US2 may be reflected by the reflective layer 310 and travel toward the first substrate 100 (EL' in FIG. 6). Accordingly, most of the light emitted from the light source 500 can travel to the first substrate 100, thereby improving the light efficiency.

The backlight unit 10 may further include a plurality of optical members to improve the efficiency of the emitted light. The optical member can prevent the light emitted from the light source 500 from being reflected or refracted. In some cases, the optical member may absorb the incident light and convert it into light having a different wavelength band. The backlight unit 10 according to an exemplary embodiment may include a plurality of optical members, and the optical member may include a diffusion sheet 710, a low refractive layer 720, and a wavelength conversion layer 730, as shown in FIGS. 7 to 9.

Figure 7:
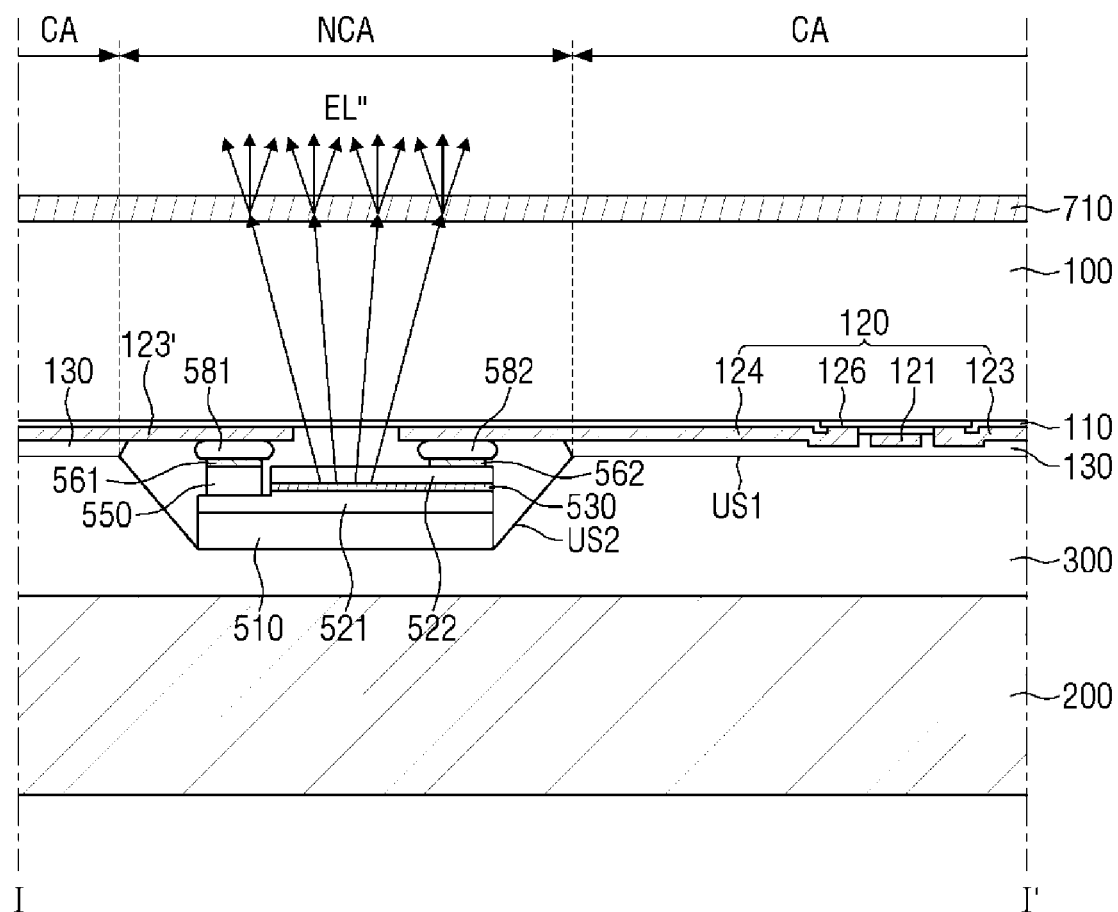
FIGS. 7, 8, and 9 are partial cross-sectional views showing a backlight unit including an optical member according to another exemplary embodiment.
Figure 8:
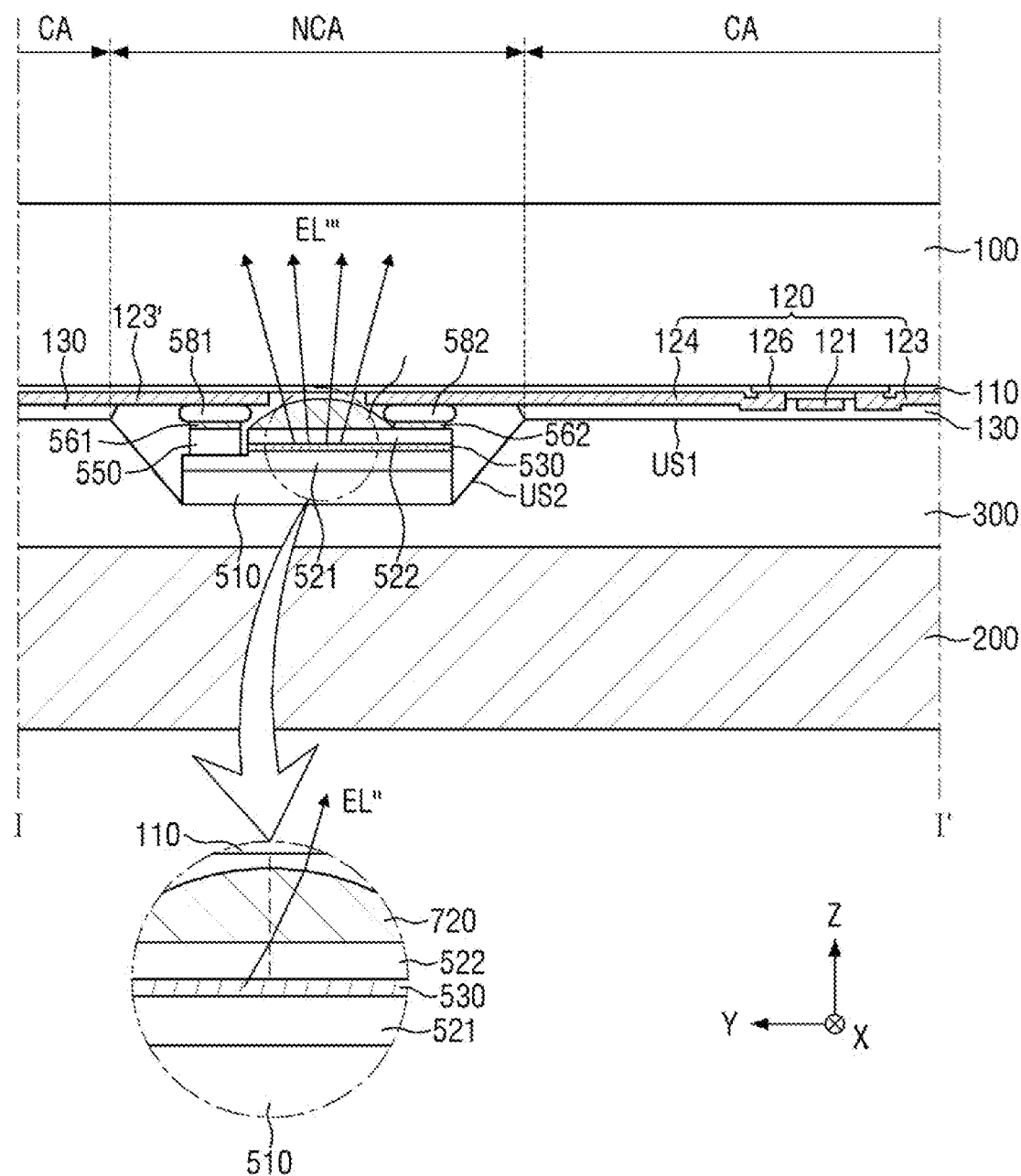
Figure 9:
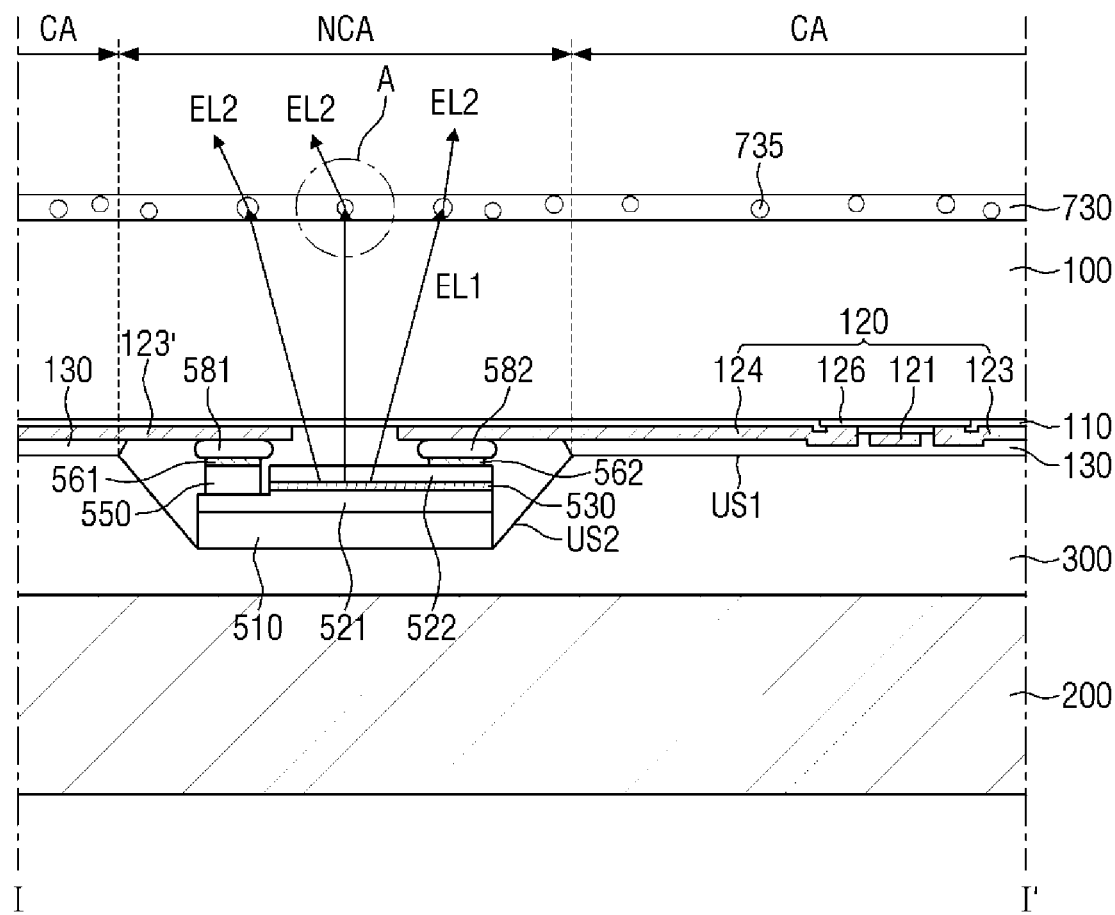

FIGS. 7 to 9 are partial cross-sectional views showing a backlight unit including an optical member according to another exemplary embodiment.

First, referring to FIG. 7, the backlight unit 10 according to an exemplary embodiment may include the diffusion sheet 710 disposed on the first substrate 100.

The diffusion sheet 710 may function to diffuse the light EL emitted from the light source 500 through the first substrate 100. As shown in the figure, the lights emitted from the first substrate 100 are incident on the diffusion sheet 710, and the diffusion sheet 710 may diffuse the lights without directionality (EL" in FIG. 7). The diffusion sheet 710 may diffuse the light emitted from the backlight unit 10 such that it does not travel only in a specific direction. Thus, the backlight unit 10 can emit light of uniform density through the diffusion sheet 710.

The light emitted from the active material layer 530 of the light source 500 travels toward the first substrate 100 through the second conductivity type semiconductor 522. As described above, the light source 500 may be separated from the first substrate 100, and a separation distance may exist partially between the second conductivity type semiconductor 522 and the first substrate 100. The light emitted from the active material layer 530 may be reflected at the boundary between the second conductivity type semiconductor 522 and the first substrate 100 and travel in another direction. In some cases, although the light is emitted from the second conductivity type semiconductor 522, it may not be incident on the first substrate 100 but may be reflected. The backlight unit 10 according to an exemplary embodiment may further include the low refractive layer 720 which reduces a refractive index difference between the second conductivity type semiconductor 522 of the light source 500 and the first substrate 100.

Referring to FIG. 8, the backlight unit 10 may further include the low refractive layer 720 disposed between the light source 500 and the first substrate 100. The low refractive layer 720 may be disposed between the light source 500 and the first substrate 100, i.e., on the second conductivity type semiconductor 522. The shape of the low refractive layer 720 is not particularly limited. As shown in FIG. 8, the low refractive layer 720 may have a lens shape with a curved outer surface or may have a sheet-like shape. The low refractive layer 720 may be separated from the first substrate 100 by a predetermined distance. However, without being limited thereto, the low refractive layer 720 may be disposed to fill the separation space between the first substrate 100 and the light source 500.

The low refractive layer 720 functions to reduce a refractive index difference between the light source 500 and the first substrate 100. The refractive index of the low refractive layer 720 may have a value between the refractive index of the light source 500, i.e., the refractive index of the second conductivity type semiconductor 522, and the refractive index of the first substrate 100. Light EL''' emitted from the active material layer 530 of the light source 500 and traveling to the second conductivity type semiconductor 522 may have a reduced probability of being reflected at the interface with the low refractive layer 720. Since the refractive index difference between the second conductivity type semiconductor 522 and the low refractive layer 720 is small, most of the light emitted from the light source 500 may travel to the low refractive layer 720 without being reflected. Most of the light EL''' passing through the low refractive layer 720 may travel without being reflected even at the interface with the first substrate 100. The backlight unit 10 including the low refractive layer 720 can improve the light efficiency by reducing the amount of light reflected and lost between the light source 500 and the first substrate 100.

As described above, the backlight unit 10 may further include the wavelength conversion layer 730 which converts the wavelength band of the light emitted from the light source 500.

Referring to FIG. 9, the backlight unit 10 according to an exemplary embodiment may further include the wavelength conversion layer 730 which converts a central wavelength band of incident light. The wavelength conversion layer 730 may be disposed on the first substrate 100. The light (EL1 in FIG. 9) emitted from the light source 500 may be incident on the wavelength conversion layer 730 before being emitted from the backlight unit 10 through the first substrate 100.

The wavelength conversion layer 730 may be disposed entirely on the upper surface of the first substrate 100. The plurality of light sources 500 may be disposed between the first substrate 100 and the heat dissipation sheet 300, and the light EL1 may be entirely emitted toward the upper surface of the first substrate 100. The lights EL1 emitted from the upper surface of the first substrate 100 may be incident on the wavelength conversion layer 730, and the wavelength conversion layer 730 may emit second light EL2 having a different wavelength band from first light EL1. Since the wavelength conversion layer 730 converts the wavelength band of light emitted from the light source 500, the backlight unit 10 can emit light having a different wavelength band or a different color from the light emitted from the light source 500.

The wavelength conversion layer 730 according to an exemplary embodiment may include wavelength conversion particles 735 which convert the first light EL1 incident from the light source 500 into the second light EL2 having a different wavelength band.

Figure 10:
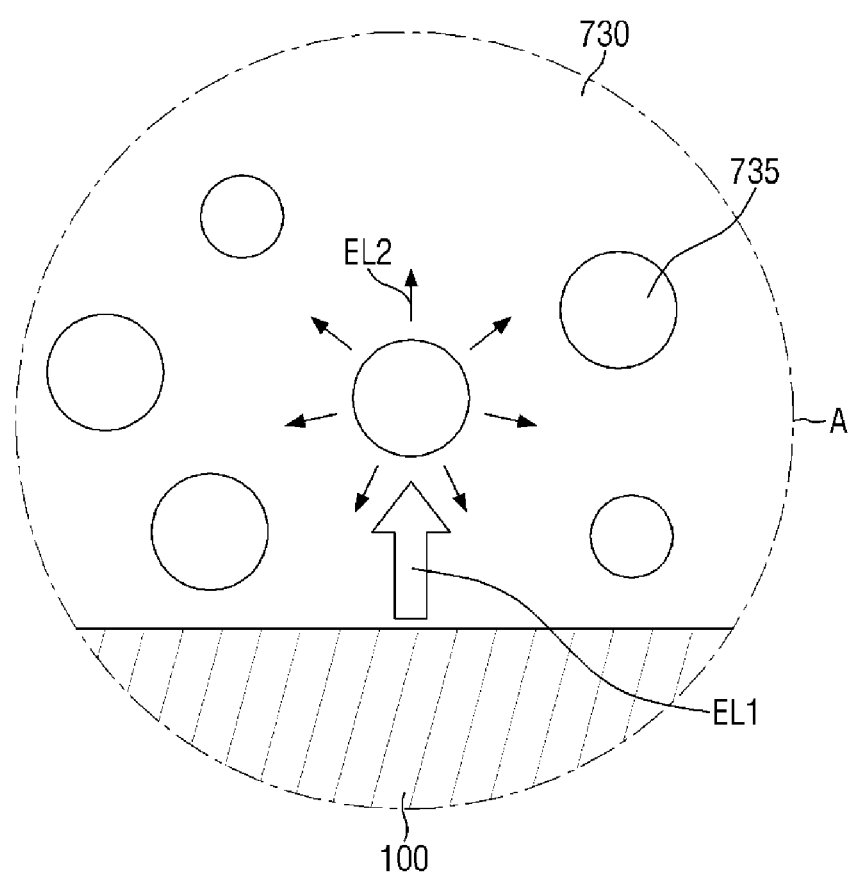
FIG. 10 is an enlarged view of portion A of FIG. 9.

FIG. 10 is an enlarged view of portion A of FIG. 9.

Referring to FIG. 10, the wavelength conversion layer 730 may include at least one wavelength conversion particle 735. The wavelength converting particle 735 may convert the first light EL1 incident from the light source 500 into the second light EL2 having a different wavelength band and emit the second light EL2. As shown in FIG. 9, the wavelength conversion particle 735 may be a nanometer-size particle having a spherical shape and may be a quantum dot of a core-shell structure, a quantum rod, a phosphor, or a perovskite material.

In one example, the wavelength conversion particle 735 may have a particle size ranging from 2 nm to 300 nm, from 5 nm to 200 nm, from 10 nm to 100 nm, or from 20 nm to 50 nm. When the wavelength conversion particle 735 is a quantum dot, the quantum dot may be a semiconductor nanocrystal material. The quantum dot may be adjusted to have a specific band gap by varying the size of the particles and the kind of material in the core-shell structure, and the central wavelength band of the converted second light EL2 may be adjusted. Examples of the semiconductor nanocrystal of the quantum dot may include Group IV nanocrystals, Group II-VI compound nanocrystals, Group III-V compound nanocrystals, Group IV-VI nanocrystals, or a combination thereof. However, the inventive concepts are not limited thereto.

Further, the wavelength conversion particles 735 may be dispersed on light-transmitting resin (not shown) in the wavelength conversion layer 730. The light-transmitting resin is not particularly limited as long as it does not absorb light incident on the wavelength conversion layer 730 and does not affect the light absorption and emission of the wavelength conversion particles 735.

At least a portion of the first light EL1 incident on the wavelength conversion layer 730 may be incident on the wavelength conversion particles 735 and converted into the second light EL2, and the remaining portion of the first light EL1 may be emitted from the backlight unit 10 through the wavelength conversion layer 730. The light emitted from the backlight unit 10 may be a mixed light of the first light EL1 of the light source 500 and the second light EL2 of the wavelength conversion layer 730. Alternatively, the wavelength conversion layer 730 may include various kinds of wavelength conversion particles 735 to emit second lights EL2 having different wavelength bands.

In an exemplary embodiment, the wavelength conversion layer 730 includes one or more kinds of wavelength conversion particles 735, and the second light EL2 emitted from the wavelength conversion layer 730 may be a mixed light in which lights having different wavelengths are mixed. For example, the backlight unit 10 may be configured such that the light source 500 emits light of a blue wavelength band, and the wavelength conversion layer 730 converts light of a blue wavelength band into a mixed light of a white wavelength band and emits the converted light. However, the inventive concepts are not limited thereto.

Although FIG. 9 illustrates that the wavelength conversion layer 730 is disposed on the first substrate 100, if the light emitted from the light source 500 can be incident on the wavelength conversion layer 730, the structure or arrangement thereof may be changed. For example, the wavelength conversion layer 730 may be disposed between the light source 500 and the first substrate 100, similarly to the low refractive layer 720. Various exemplary embodiments of the wavelength conversion layer 730 may refer to other drawings.

As described above, since the first substrate 100 includes a transparent material such that light of the light source 500 can be transmitted therethrough, light incident from the outside may be incident on the transistor 120 disposed on the lower surface of the first substrate 100 through the first substrate 100. In order to prevent this condition, the first substrate 100 may further include a light blocking film 150 disposed below the circuit element layer 100a.

Figure 11:
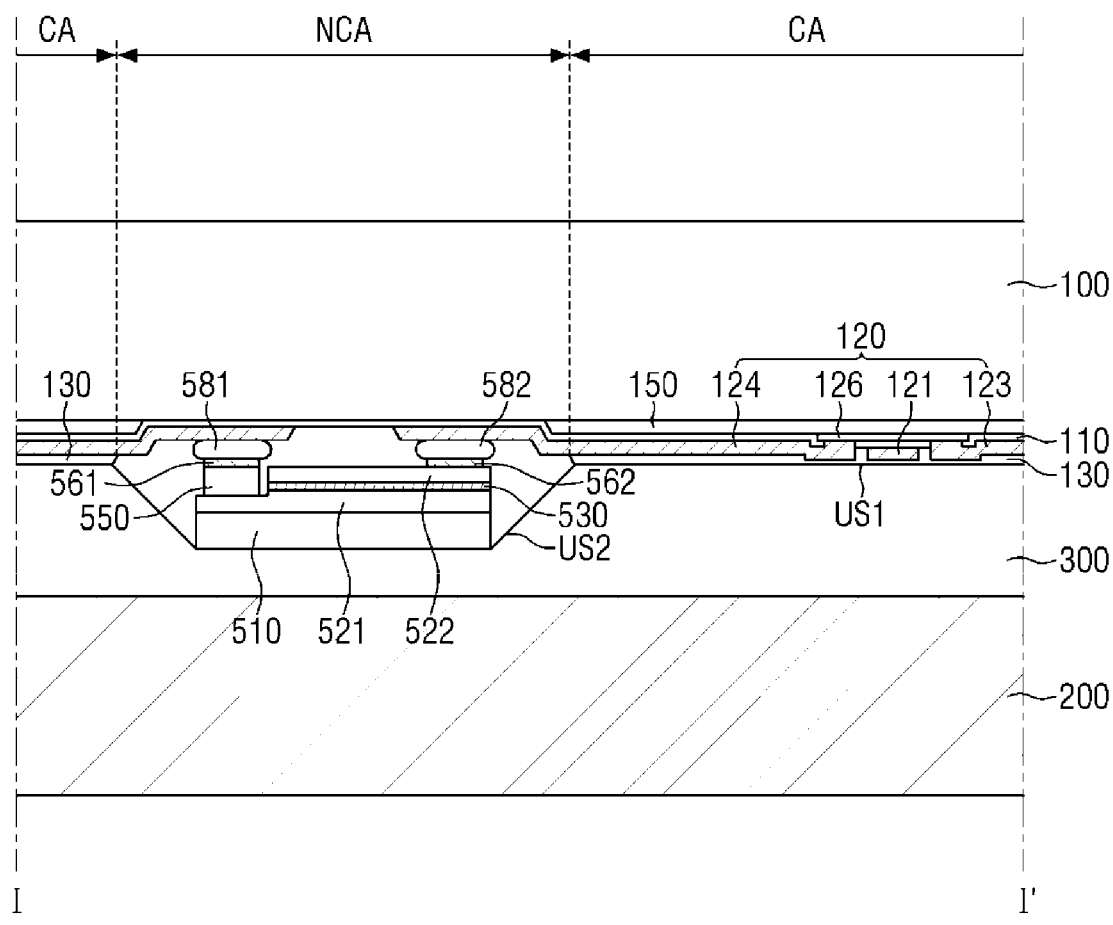
FIG. 11 is a partial cross-sectional view of a backlight unit according to an exemplary embodiment.
Figure 11:
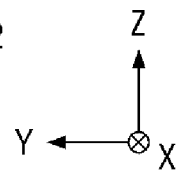
Figure 12:
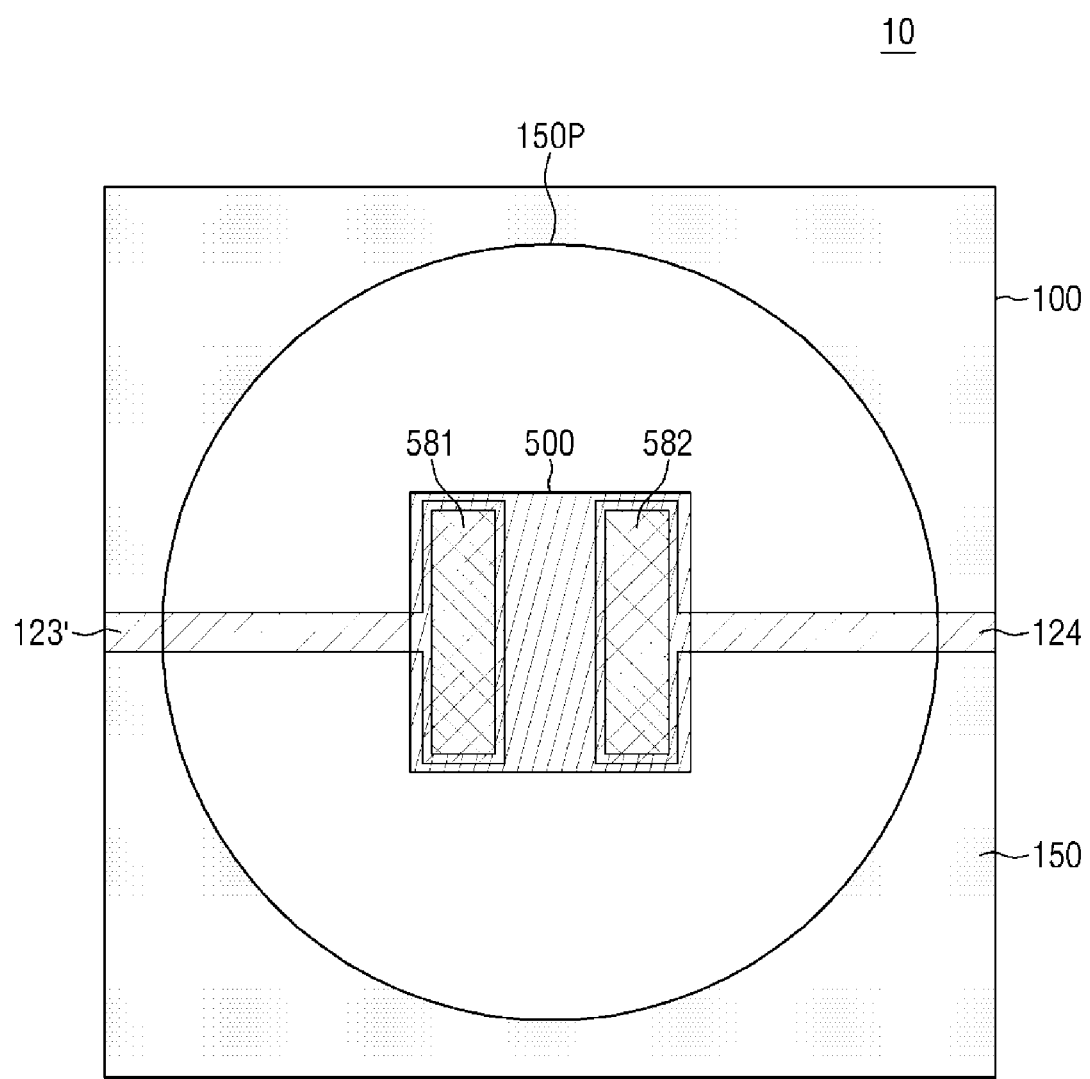
FIG. 12 is a partial plan view of the backlight unit of FIG. 11.

FIG. 11 is a partial cross-sectional view of a backlight unit according to an exemplary embodiment. FIG. 12 is a partial plan view of the backlight unit of FIG. 11. FIG. 12 is a plan view of the second region NCA of the heat dissipation sheet 300 in the backlight unit 10 of FIG. 11.

Referring to FIGS. 11 and 12, the first substrate 100 of the backlight unit 10 may further include the light blocking film 150 disposed between the circuit element layer 100a and the lower surface of the first substrate 100.

The light blocking film 150 can prevent external light incident through the upper surface of the first substrate 100 from being incident on the circuit element layer 100a. The light blocking film 150 is disposed to overlap at least the transistor 120 and can prevent light from being incident on the active layer 126 of the transistor 120. For example, the light blocking film 150 may be formed of an opaque metal material that blocks transmission of light.

The light blocking film 150 may be disposed between the first substrate 100 and the circuit element layer 100a, but may not be disposed in a portion of the circuit element layer 100a such that light emitted from the light source 500 may travel through the first substrate 100. In an exemplary embodiment, the light blocking film 150 may include an opening 150P which partially overlaps the light source 500. The opening 150P may be disposed so as to partially overlap the light source 500, and the light emitted from the light source 500 may travel to the first substrate 100 through the opening 150P in which the light blocking film 150 is not disposed.

As shown in FIGS. 11 and 12, the light blocking film 150 may be disposed on the lower surface of the first substrate 100, and the opening 150P may be formed to expose the light source 500 disposed in the second region NCA of the heat dissipation sheet 300. The light blocking film 150 may have the opening 150P along the light source 500 disposed on the lower surface of the first substrate 100. That is, the light blocking film 150 may be disposed such that a plurality of openings 150P overlap the second region NCA of the heat dissipation sheet 300.

The light blocking film 150 may include at least one opening 150P which overlaps one light source 500. The opening 150P may be formed such that one opening 150P entirely exposes one light source 500, and the plurality of openings 150P may be formed to partially expose one light source 500.

Referring to FIG. 12, the drain electrode 124 of one transistor 120 and the source electrode 123' of another transistor may extend in one direction so as to be simultaneously connected to one light source 500 and may terminate to be separated from each other. The drain electrode 124 and the source electrode 123' may be in contact with the conductive balls 581 and 582 of the light source 500, respectively. The drain electrode 124 and the source electrode 123' may be extended to have a predetermined width at each end, and the contact area with the conductive balls 581 and 582 may increase. The opening 150P of the light blocking film 150 may partially expose the source electrode 123' and the drain electrode 124 as well as the light source 500.

In FIG. 12, it is illustrated that one opening 150P has a circular shape in a plan view, and is disposed to entirely expose the light source 500. That is, the opening 150P of the light blocking film 150 may be disposed to overlap the light source 500, and the planar area may be larger than the area of the light source 500. However, the inventive concepts are not limited thereto, and the opening 150P of the light blocking film 150 may have various shapes. In some cases, the opening 150P may be disposed to partially expose the light source 500. A description thereof may refer to other exemplary embodiments.

Hereinafter, another exemplary embodiment of the backlight unit 10 will be described with reference to other drawings.

Figure 13:
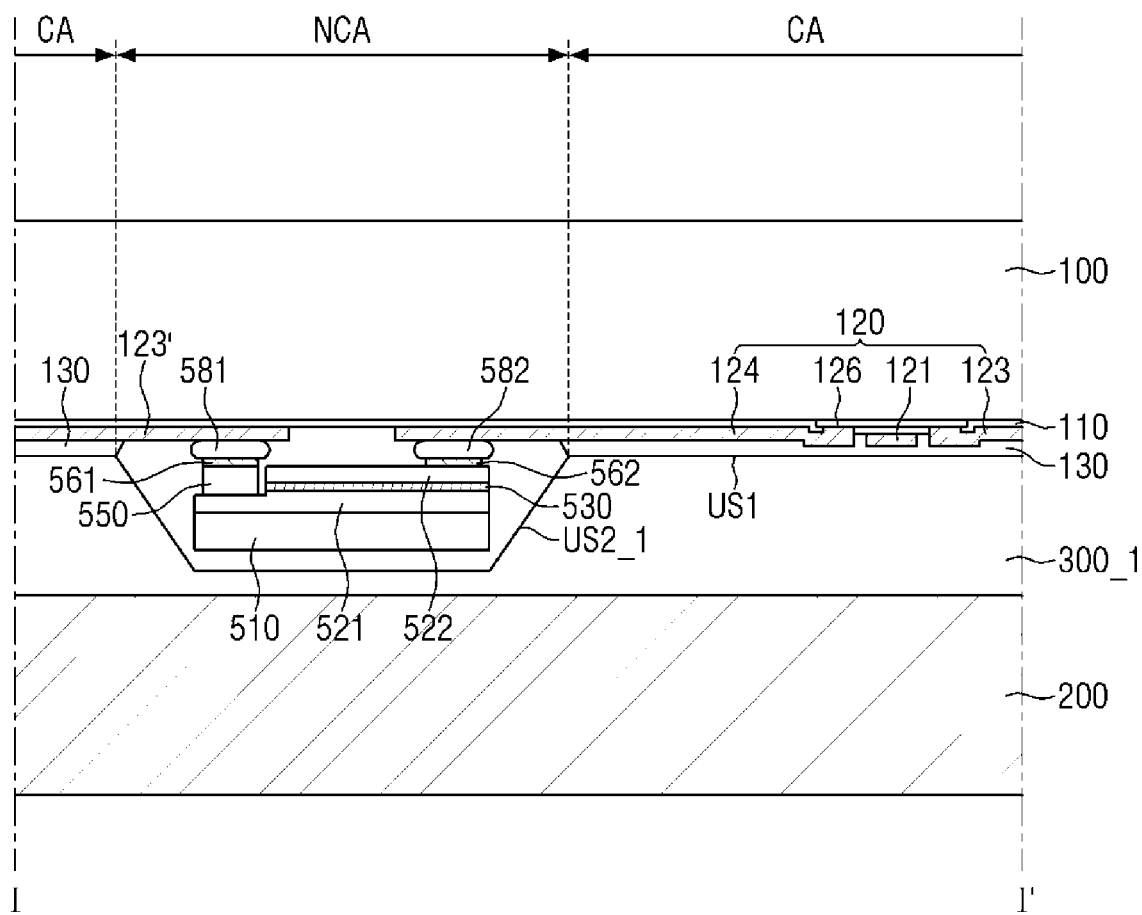
FIG. 13 is a partial cross-sectional view of a backlight unit according to exemplary another embodiment.

FIG. 13 is a partial cross-sectional view of a backlight unit according to another exemplary embodiment.

Referring to FIG. 13, a backlight unit 10_1 according to another exemplary embodiment may be formed such that a second surface US2_1 is separated from the light source 500 in a second region NCA of a heat dissipation sheet 300_1. As described above, the second surface US2_1 of the heat dissipation sheet 300_1 may include an inclined surface and a flat surface parallel to the first substrate 100. Unlike the backlight unit 10 of FIG. 3, the backlight unit 10_1 of FIG. 13 may be configured such that the flat surface of the second surface US2_1 is not in contact with the light source 500. By disposing the heat dissipation sheet 300_1 and the light source 500 to be separated from each other at a predetermined interval, it is also possible to prevent damage to the light source 500 in a manufacturing process of the backlight unit 10_1.

The second surface US2_1 of the heat dissipation sheet 300_1 is disposed so as to surround the light source 500 so that the heat H2 (see FIG. 5) generated in the light source 500 can be emitted relatively uniformly through the inclined surface and the flat surface. On the other hand, the first surface US1 of the heat dissipation sheet 300_1 maintains a state of being in contact with the circuit element layer 100a, particularly the transistor 120, thereby effectively discharging the heat H1 (see FIG. 5) generated in the transistor 120.

Figure 14:
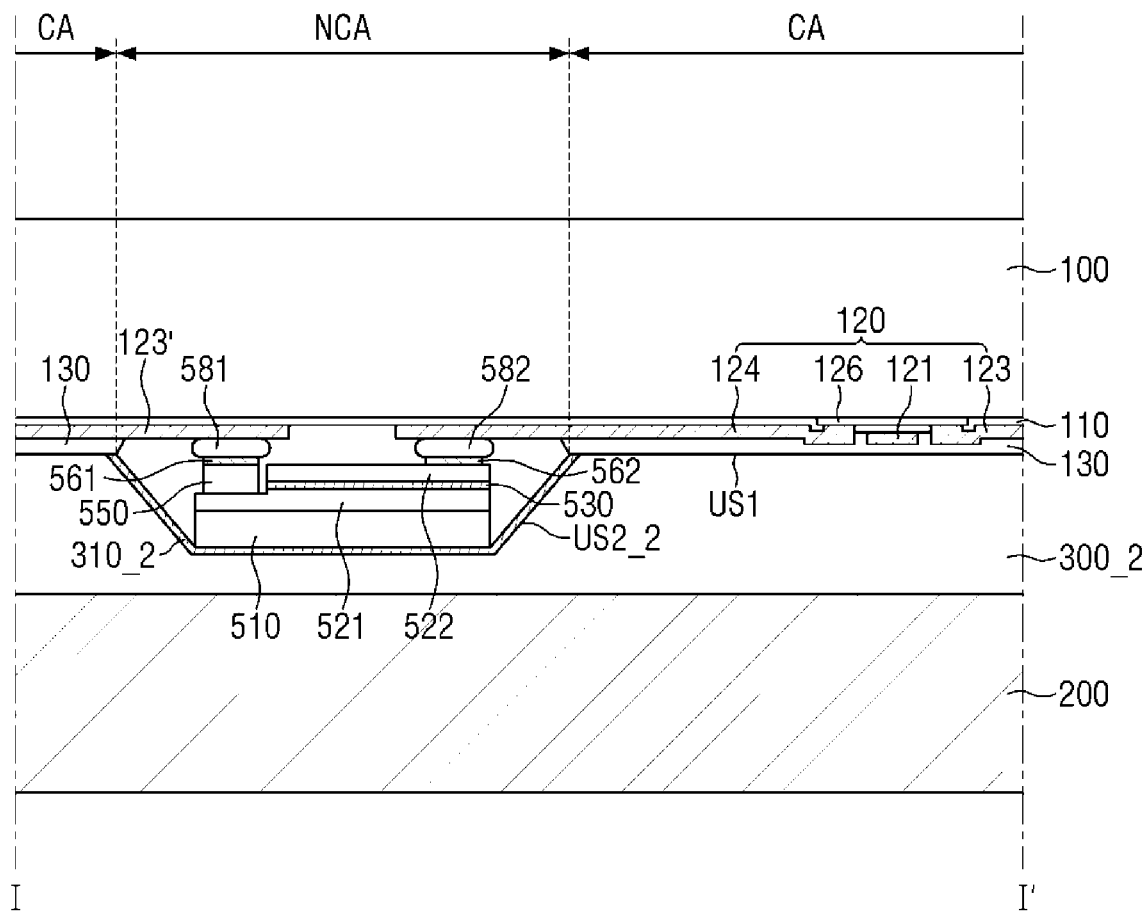
FIGS. 14 and 15 are partial cross-sectional views of a backlight unit including a reflective layer according to another exemplary embodiment.
Figure 15:
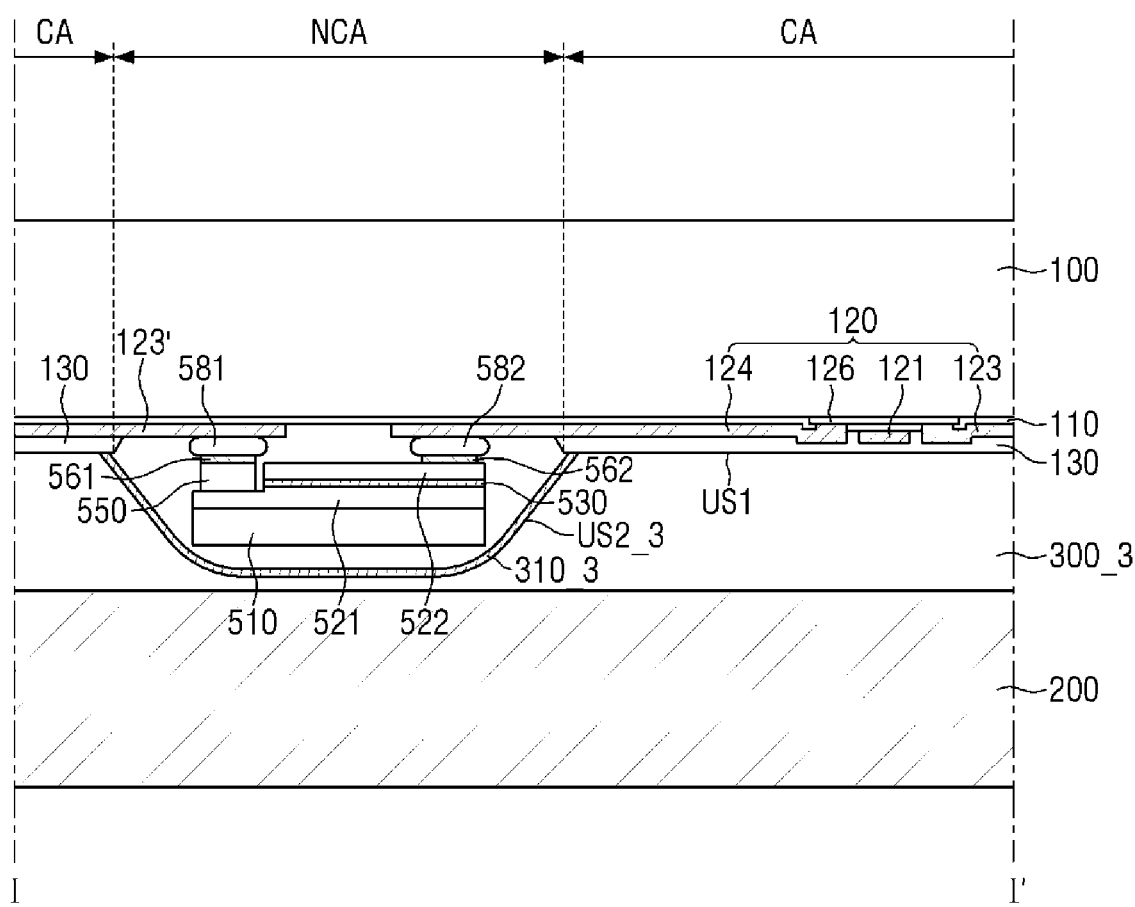
Figure 15:
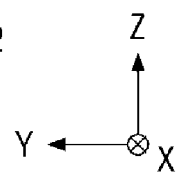

FIGS. 14 and 15 are partial cross-sectional views of a backlight unit including a reflective layer according to another exemplary embodiment.

As described above, the backlight unit 10 may further include the reflective layer 310, and the reflective layer 310 may be disposed between the light source 500 and the heat dissipation sheet 300. In the backlight unit 10 of FIG. 6, the reflective layer 310 is disposed in a region where the light source 500 and the second surface US2 of the heat dissipation sheet 300 are in contact with each other, but the arrangement of the reflective layer 310 is not limited thereto.

Referring to FIG. 14, a backlight unit 10_2 according to an exemplary embodiment may include a reflective layer 310_2 disposed to cover a second surface US_2 of a heat dissipation sheet 300_2. The backlight unit 10_2 of FIG. 14 may be configured such that the reflective layer 310_2 is disposed to entirely cover the second surface US2_2 of the heat dissipation sheet 300_2 unlike the backlight unit 10 of FIG. 6. As described above, the light emitted from the light source 500 is emitted in all directions without limitation in directionality. The light source 500 may emit light toward the entire area of the second surface US 2_2 of the heat dissipation sheet 300_2 disposed so as to surround it. In the backlight unit 10_2 according to an exemplary embodiment, the reflective layer 310_2 may be disposed to reflect the light emitted toward the entire area of the second surface US2_2 toward the first substrate 100.

The reflective layer 310_2 of FIG. 14 may be disposed on the inclined surface as well as the flat surface in contact with or facing the light source 500 and the second surface US2_2. Accordingly, a portion of the light emitted from the light source 500 traveling in a direction different from the direction toward the first substrate 100 can be reflected through the reflective layer 310_2.

Referring to FIG. 15, a backlight unit 10_3 according to an exemplary embodiment may be configured such that a second surface US2_3 of a heat dissipation sheet 300_3 has a curved shape at least in a partial region and a reflective layer 310_3 is disposed entirely on the curved second surface US2_3. The second surface US2_3 of the heat dissipation sheet 300_3 of FIG. 15 may have a rounded shape with a predetermined curvature in a region where the inclined surface and the flat surface meet, unlike the case illustrated in FIG. 6. The reflective layer 310_3 disposed on the second surface US2_3 may have a curved shape rather than an angular shape in a region where the inclined surface and the flat surface meet.

Since the second surface US2_3 of the heat dissipation sheet 300_3 and the reflective layer 310_3 have a curved shape, the light emitted from the light source 500 and reflected by the reflective layer 310_3 can be concentrated toward the center of curvature. Accordingly, the amount of light reflected by the reflective layer 310_3 and traveling to the first substrate 100 can be increased as compared with the case where the second surface US2_3 and the reflective layer 310_3 have an angular shape.

The heat dissipation sheet 300 and the second substrate 200 may include a material, e.g., metal, having high thermal conductivity in order to smoothly discharge the heat generated by the light source 500 and the transistor 120. The reflective layer 310 disposed between the heat dissipation sheet 300 and the light source 500 may also include a material having high reflectivity, such as metal, to reflect the light emitted from the light source 500. The backlight unit 10 according to an exemplary embodiment may include a heat dissipation substrate in which the heat dissipation sheet 300, the reflective layer 310 and the second substrate 200 are formed integrally with each other.

Figure 16:
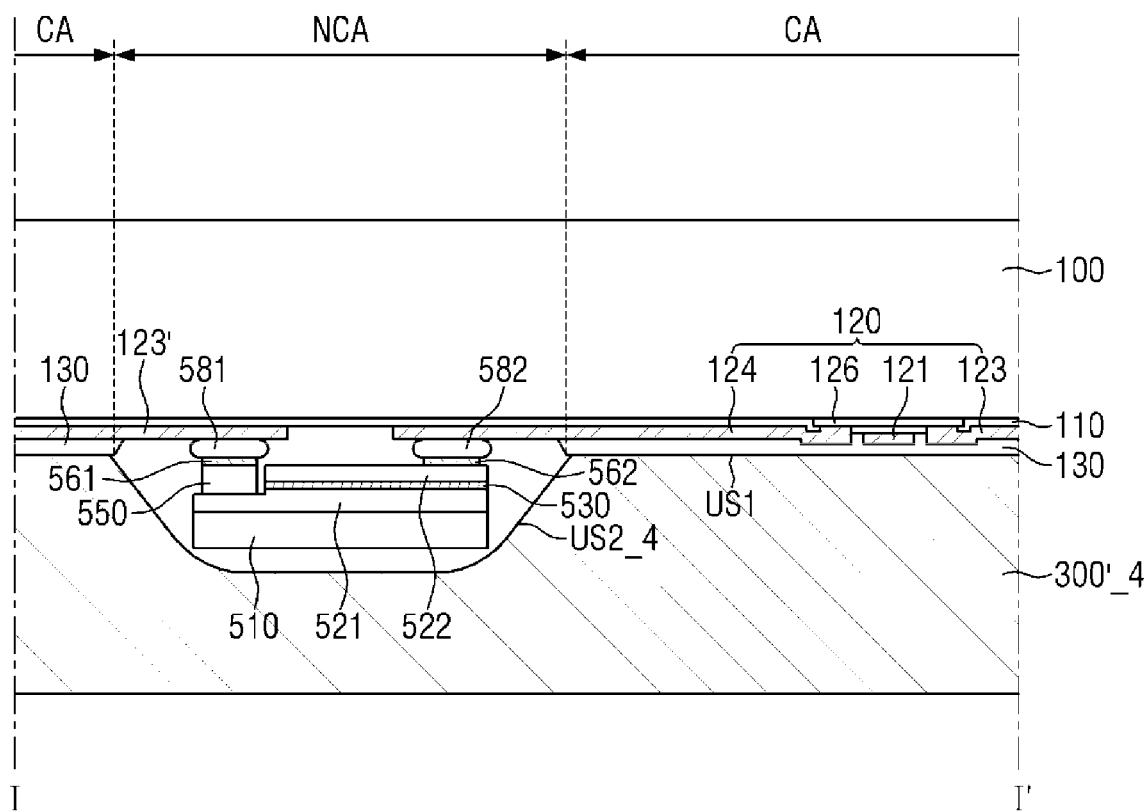
FIGS. 16, 17, and 18 are partial cross-sectional views of a backlight unit including a heat dissipation sheet according to another exemplary embodiment.
Figure 17:
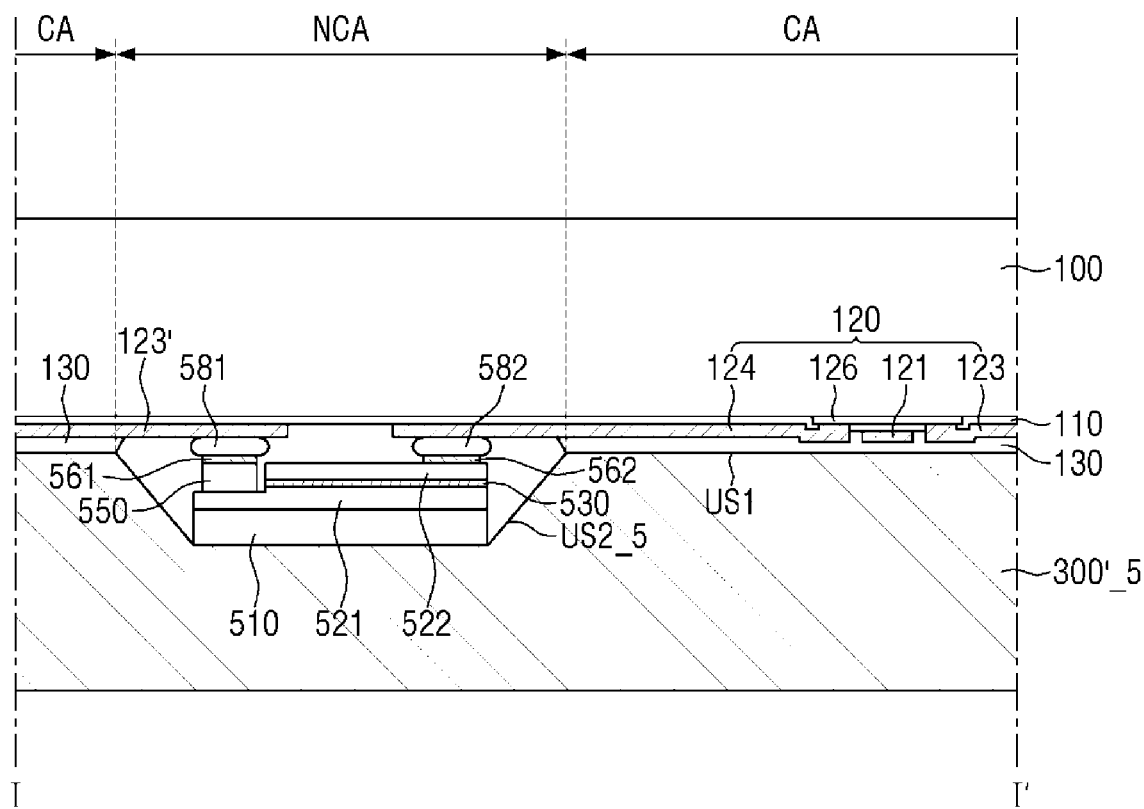
Figure 17:
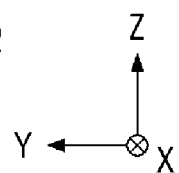
Figure 18:
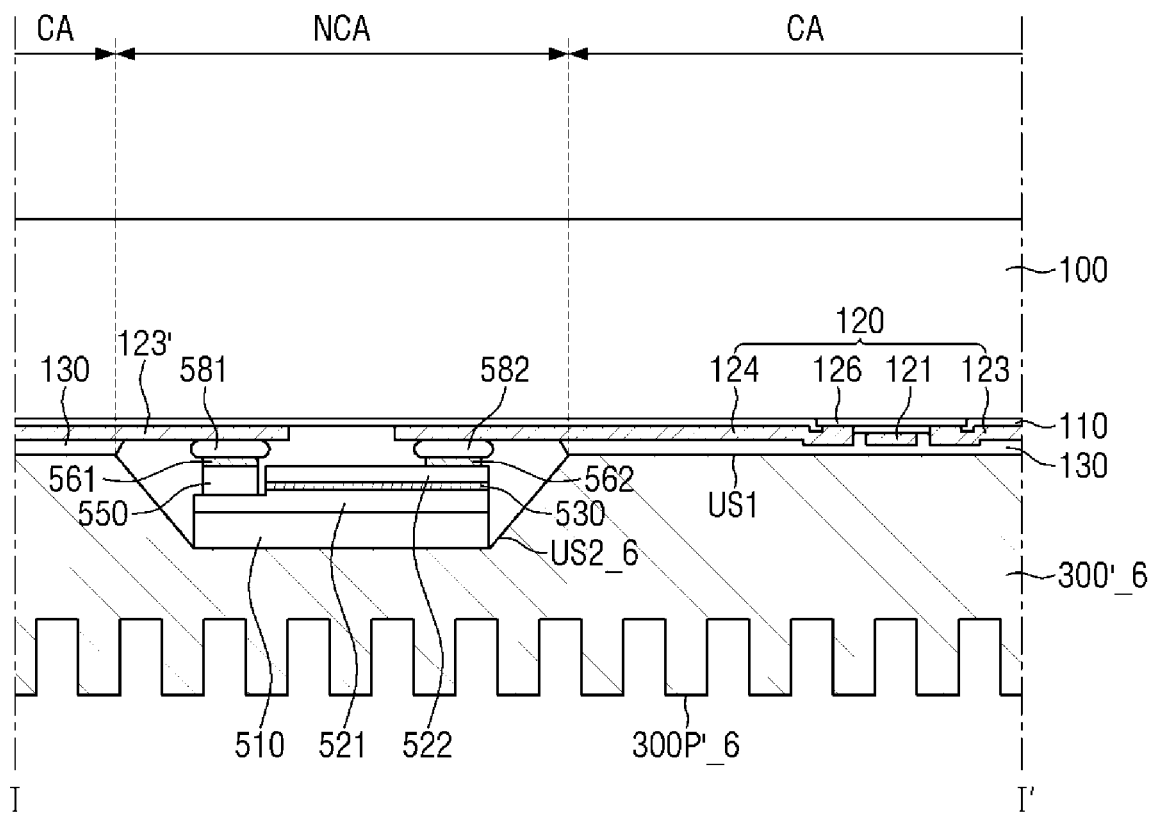

FIGS. 16 to 18 are partial cross-sectional views of a backlight unit including a heat dissipation sheet according to another exemplary embodiment.

First, referring to FIGS. 16 and 17, backlight units 10_4 and 10_5 according to an exemplary embodiment may include heat dissipation substrates 300'_4 and 300'_5 which face the first substrate 100 and are in contact with the first substrate 100 at least in a partial region. The heat dissipation substrates 300'_4 and 300'_5 include a first region CA and a second region NCA, which is a region other than the first region CA. The upper surfaces of the heat dissipation substrates 300'_4 and 300'_5 include the first surface US1 and second surfaces US2_4 and US2_5. Since a detailed description thereof is the same as described above, it will be omitted.

The backlight unit 10_4 of FIG. 16 is formed such that the second surface US2_4 of the heat dissipation substrate 300'_4 is separated from the light source 500. The backlight unit 10_5 of FIG. 17 is formed such that a second surface US2_5 of the light source 500 is in contact with the light source 500.

The heat dissipation substrates 300'_4 and 300'_5 may include a material having high thermal conductivity and high reflectivity. The heat dissipation substrates 300'_4 and 300'_5 may perform substantially the same functions as the reflective layer 310, the heat dissipation sheet 300, and the second substrate 200. That is, the heat dissipation substrates 300'_4 and 300'_5 can transfer heat to smoothly discharge the heat generated from the light source 500 and the transistor 120, and can reflect the light emitted from the light source 500 to the first substrate 100. When the heat dissipation substrates 300'_4 and 300'_5 include metal, the second insulating layer 130 of the circuit element layer 100a may insulate the heat dissipation substrates 300'_4 and 300'_5 from the source electrode 123 and the drain electrode 124 of the transistor 120.

The lower surface of the backlight unit 10 may partially have a structure with prominences and depressions to improve the heat dissipation efficiency. According to one exemplary embodiment, the second substrate 200 or the heat dissipation substrate 300' may include a prominence/depression pattern 300P' in which at least a part of the lower surface thereof recessed or protruded.

Referring to FIG. 18, a prominence/depression pattern 300P'_6 may be formed on the lower surface of a heat dissipation substrate 300'_6. The prominence/depression pattern 300P'_6 can more effectively discharge the heat generated by the light source 500 and the transistor 120 by increasing the surface area between the lower surface of the heat dissipation substrate 300'_6 and the outside. The heat can be emitted to the outside from the boundary between the lower surface of a backlight unit 10_6 and the outside through the heat dissipation substrate 300'_6. The prominence/depression pattern 300P'_6 formed on the lower surface of the heat dissipation substrate 300'_6 can increase the heat dissipation efficiency by increasing the surface area of the boundary.

In addition, the backlight unit 10_6 can be coupled or fastened to other members by the prominence/depression pattern 300P'_6 formed on the lower surface thereof. When the backlight unit 10_6 is disposed on a predetermined substrate, the backlight unit 10_6 may be disposed on the substrate through the prominence/depression pattern 300P'_6 formed on the lower surface without using a separate coupling member. However, the inventive concepts are not limited thereto.

Although not shown in the drawing, the prominence/depression pattern 300P'_6 of the heat dissipation substrate 300'_6 may be formed only on the second substrate 200 by separately forming the heat dissipation sheet 300 and the second substrate 200. A detailed description thereof will be omitted.

Figure 19:
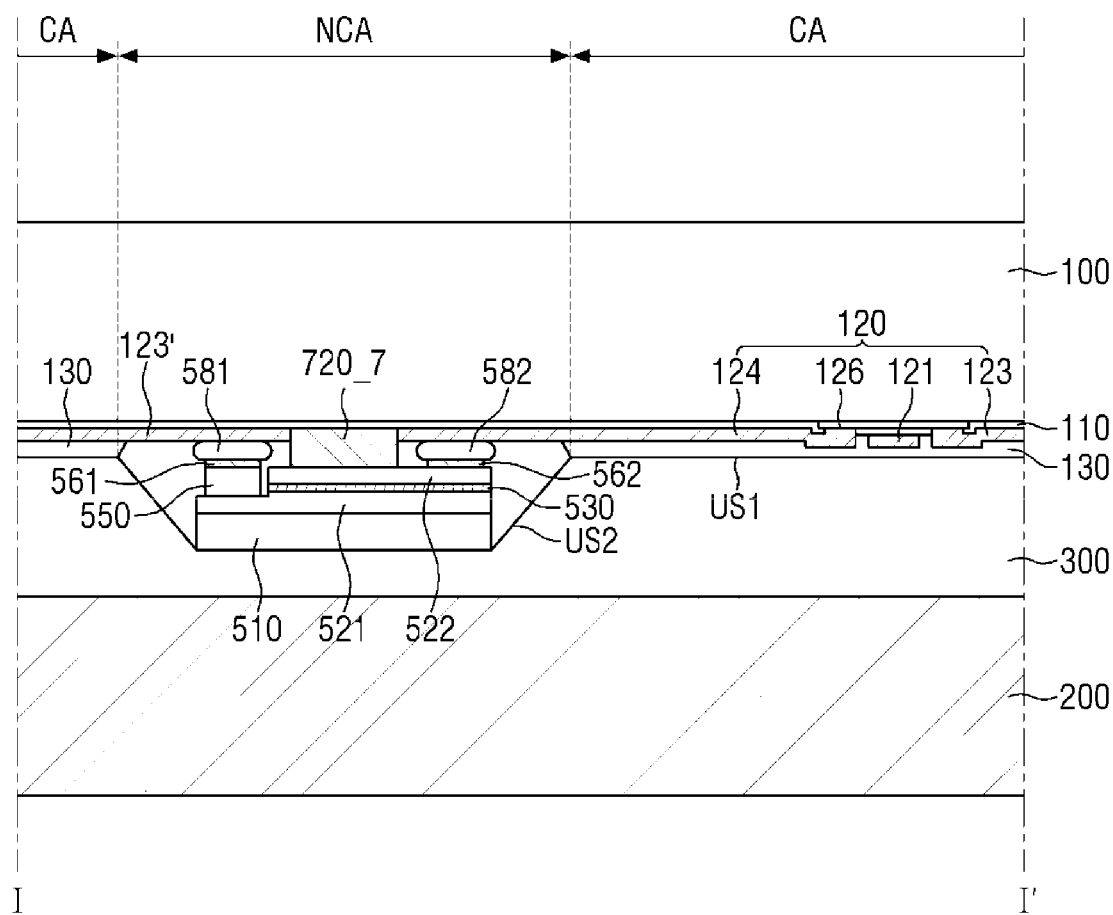
FIGS. 19, 20, and 21 are partial cross-sectional views of a backlight unit including an optical member according to another exemplary embodiment.
Figure 20:
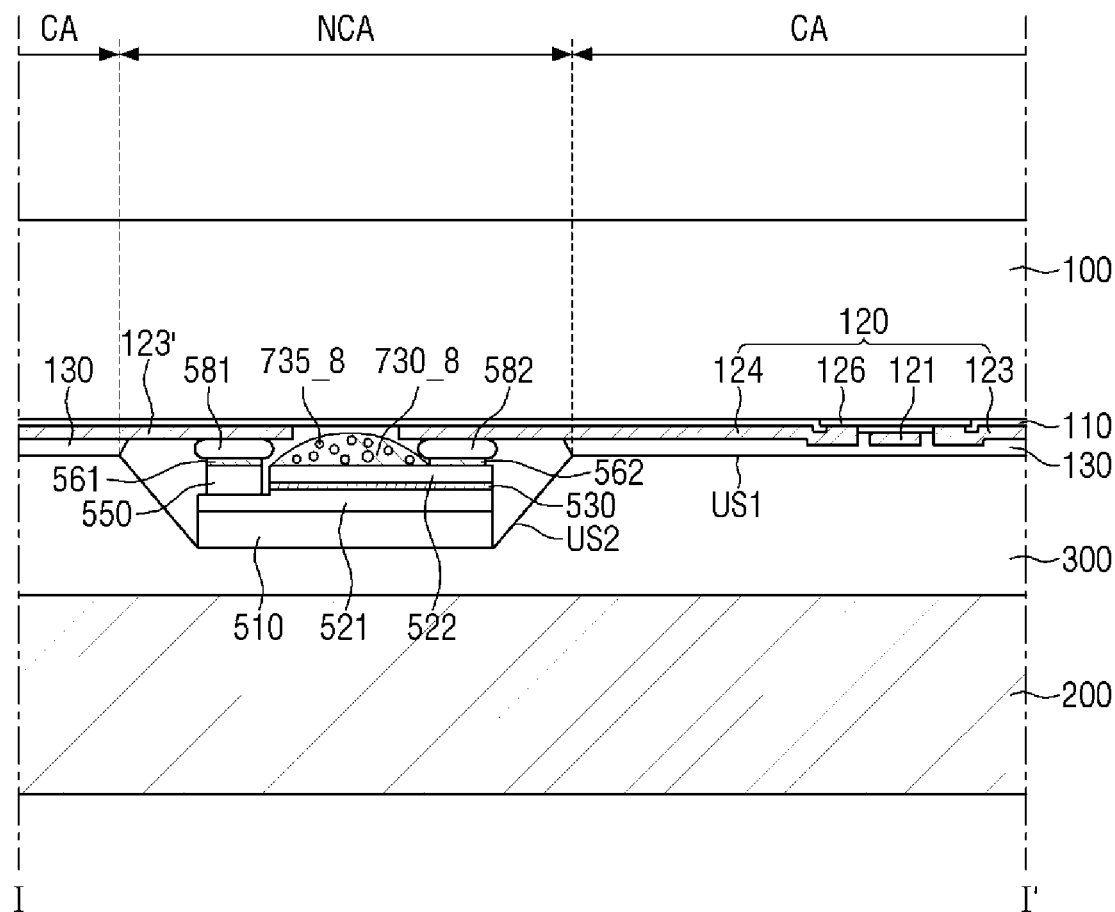
Figure 21:
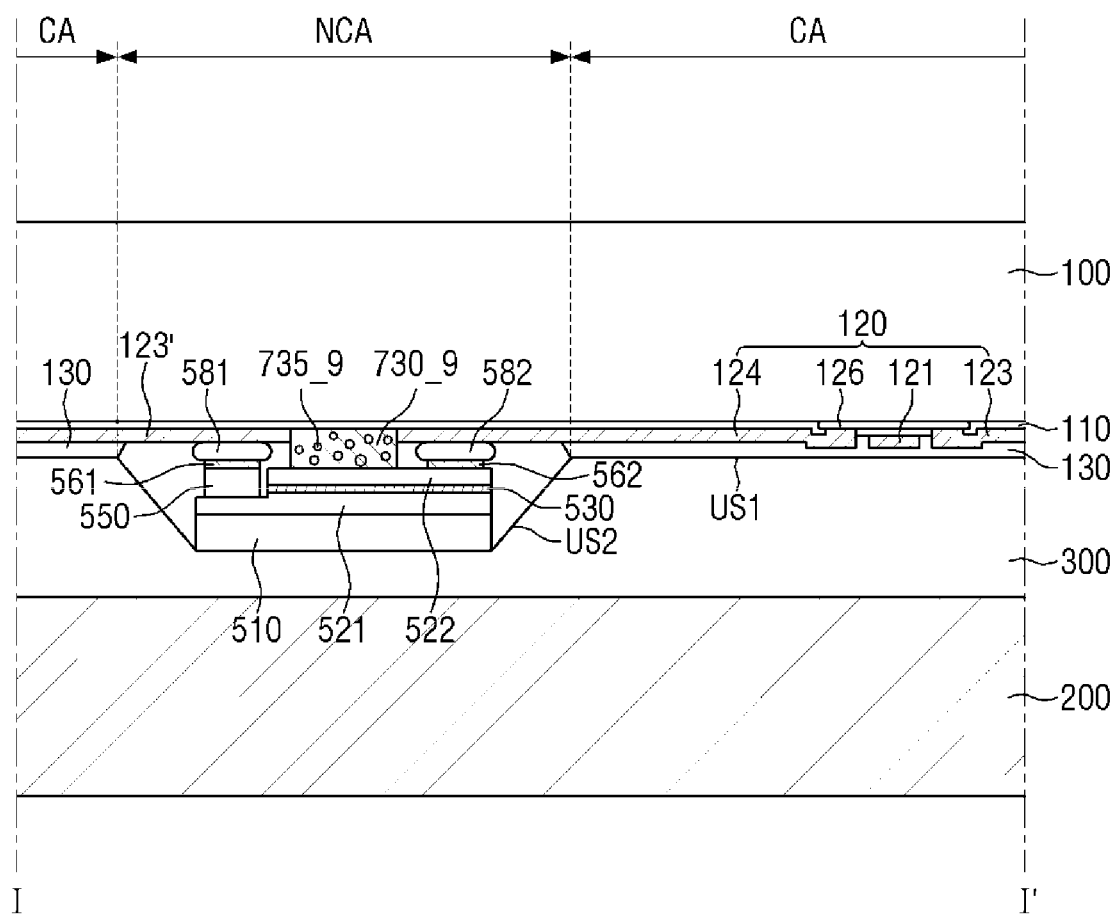

FIGS. 19 to 21 are partial cross-sectional views of a backlight unit including an optical member according to another exemplary embodiment.

Referring to FIG. 19, a backlight unit 10_7 according to an exemplary embodiment includes a low refractive layer 720_7 disposed between the first substrate 100 and the light source 500. The upper surface of the low refractive layer 720_7 may be in contact with the circuit element layer 100a of the first substrate 100, and the lower surface of the low refractive layer 720_7 may be in contact with the second conductivity type semiconductor 522 of the light source 500.

Unlike the backlight unit 10 of FIG. 8, the backlight unit 10_7 of FIG. 19 includes a sheet-type low refractive layer 720_7 and the sheet-type low refractive layer 720_7 may be disposed on the light source 500 and may be in contact with the circuit element layer 100a. The light emitted from the light source 500 may be incident on the first substrate 100 through the second conductivity type semiconductor 522 and the low refractive layer 720_7. The low refractive layer 720_7 is disposed to fill the separation space between the light source 500 and the first substrate 100, thereby preventing the light emitted from the light source 500 from being reflected without being incident on the first substrate 100.

As described above, the wavelength conversion layer 730 may be disposed between the light source 500 and the first substrate 100 instead of the upper surface of the first substrate 100.

Referring to FIGS. 20 and 21, backlight units 10_8 and 10_9 may include wavelength conversion layers 730_8 and 730_9 disposed in a separation space between the light source 500 and the first substrate 100. FIG. 20 illustrates that the wavelength conversion layer 730_8 is disposed on the light source 500 and has a lens shape with a curved outer surface, similarly to the low refractive layer 720 of FIG. 6. FIG. 21 shows that the upper surface and the lower surface of the wavelength conversion layer 730_9 are in contact with the first substrate 100 and the light source 500, respectively, in a manner similar to the low refractive layer 720_7 of FIG. 19.

The functions of the wavelength conversion layers 730_8 and 730_9 are the same as those described above with reference to FIG. 9. The first light emitted from the light source 500 is incident on the wavelength conversion layers 730_8 and 730_9 and converted into second light of a different wavelength band. Unlike the case illustrated in FIG. 9, the wavelength conversion layers 730_8 and 730_9 may be disposed between the first substrate 100 and the light source 500, and the light incident on the first substrate 100 may be a mixed light of the first light and the second light. That is, the light emitted from the backlight units 10_8 and 10_9 may be a mixed light in which the first light and the second light are mixed as shown in FIG. 9, and the light incident on the first substrate 100 of the backlight units 10_8 and 10_9 of FIGS. 20 and 21 may be a mixed light of the first light and the second light. The structure and shape of the wavelength conversion layers 730_8 and 730_9 are the same as those of the low refractive layer 720 described above with reference to FIG. 8 and FIG. 19 and, thus, a detailed description thereof will be omitted.

FIGS. 22 to 27 are partial plan views of a backlight unit including a light blocking film according to another exemplary embodiment.

The structure of the opening 150P of the light blocking film 150 is not particularly limited as long as the light emitted from the light source 500 can be emitted through the first substrate 100 without being blocked. That is, the opening 150P according to one exemplary embodiment may have a different structure from that of FIG. 12.

Figure 22:
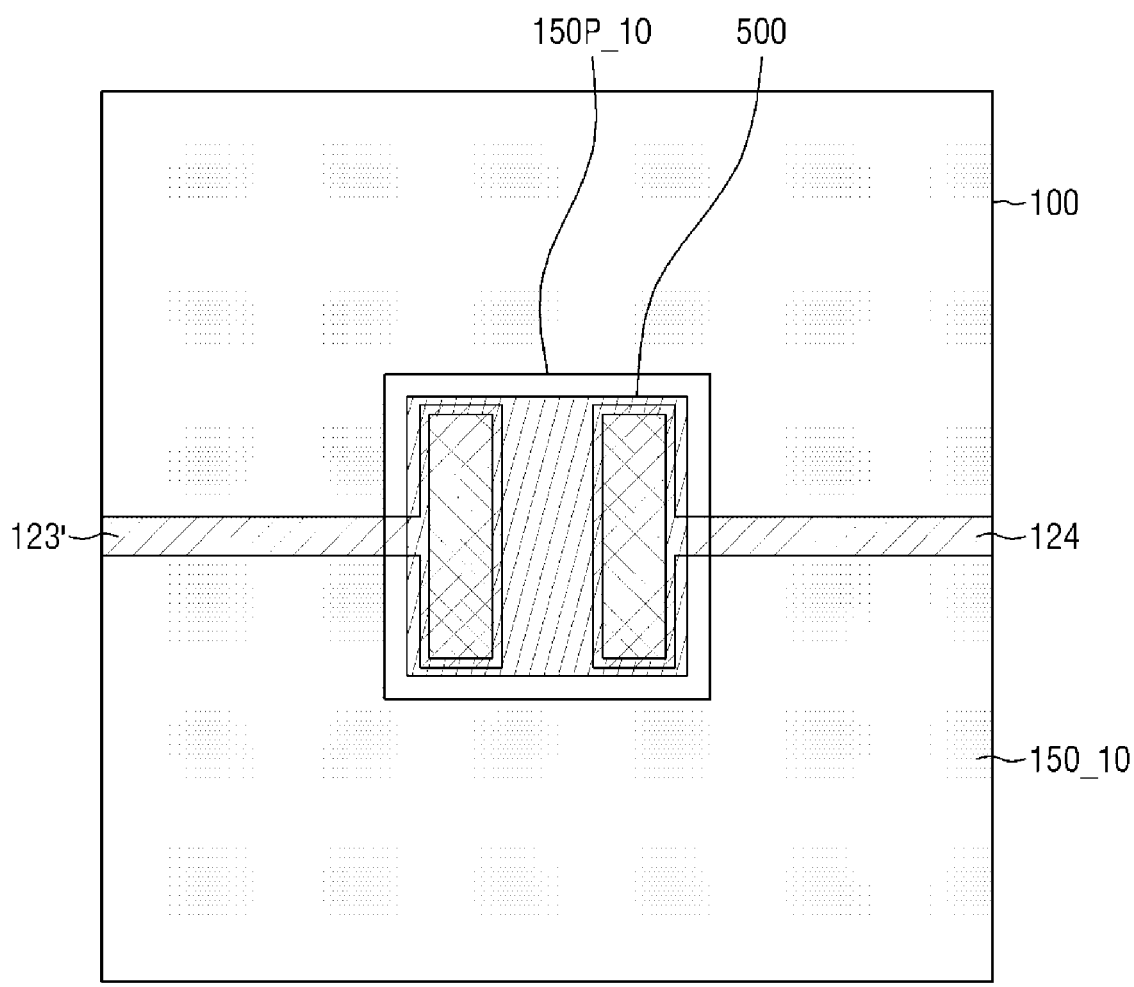
FIGS. 22, 23, 24, 25, 26, and 27 are partial plan views of a backlight unit including a light blocking film according to another exemplary embodiment
Figure 23:
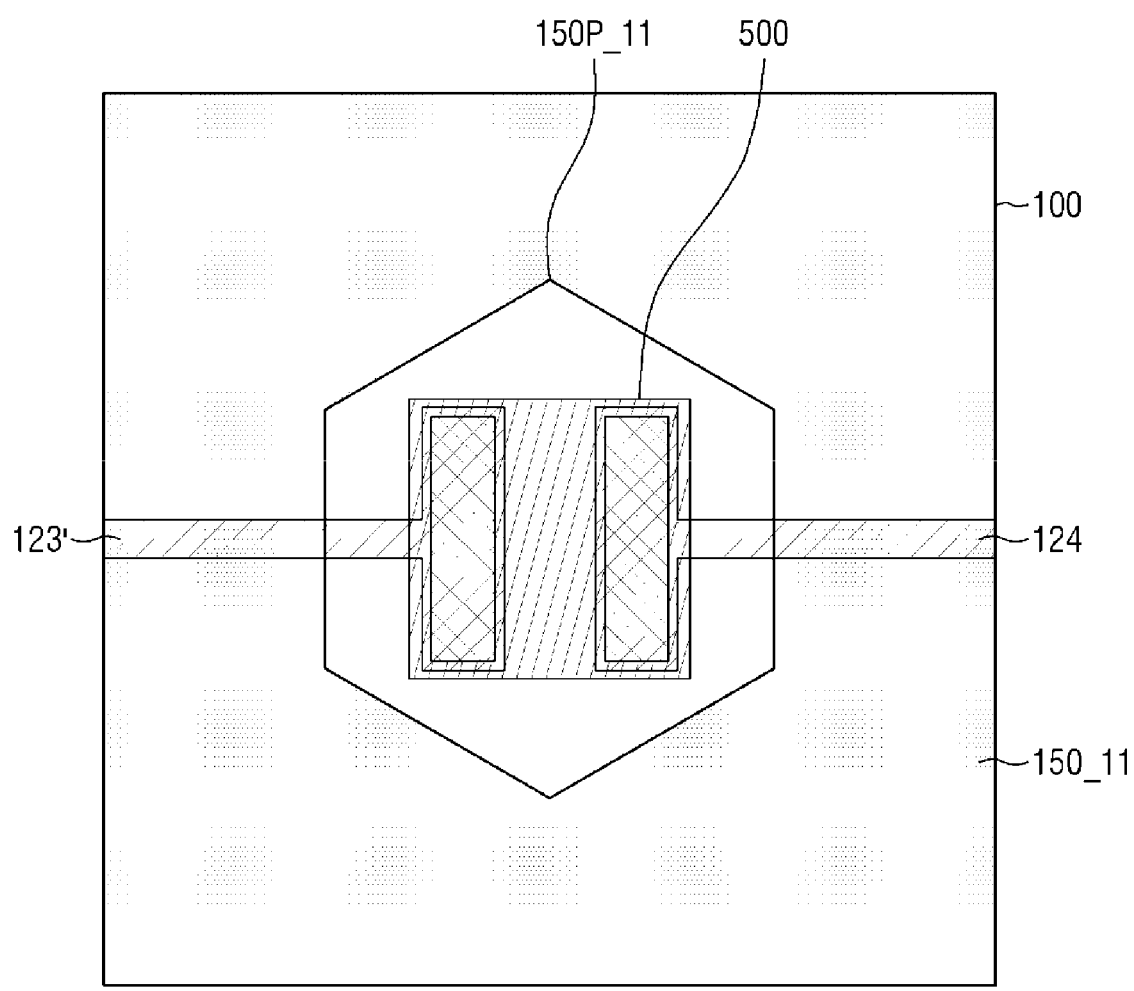
Figure 24:
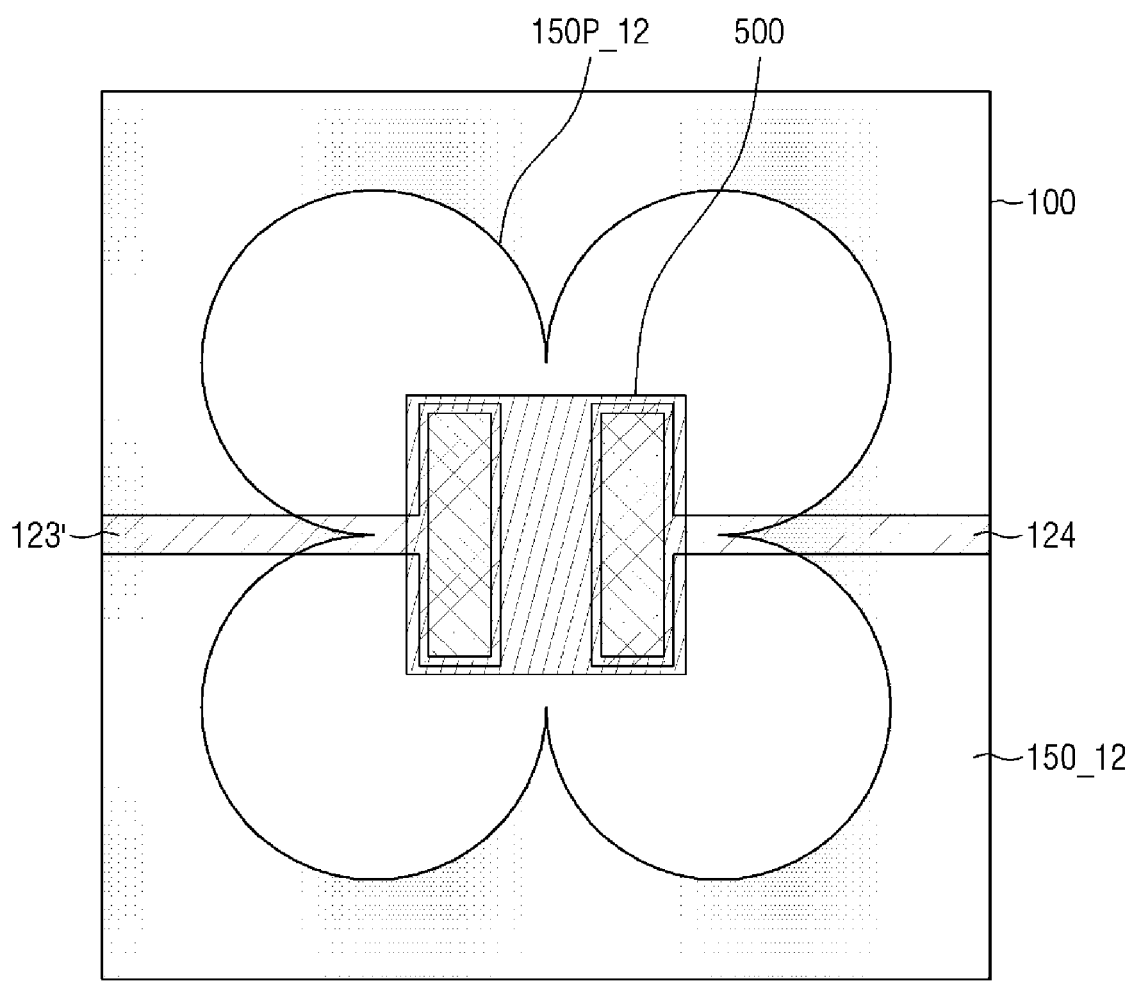

First, referring to FIGS. 22 to 24, the light blocking film 150 according to an exemplary embodiment includes an opening 150P formed to overlap the light source 500, and the opening 150P may entirely overlap the light source 500. The shape of the opening 150P is not limited to a circular shape, and may have a polygonal shape with angular sides, or a shape in which one or more circles partially overlap each other.

Referring to FIG. 22, a backlight unit 10_10 according to an exemplary embodiment may include a light blocking film 150_10 having a rectangular opening 150P_10 with walls facing each other. The opening 150P_10 of FIG. 22 may have substantially the same shape as the planar shape of the light source 500. The opening 150P_10 entirely overlaps the light source 500, and has the same shape as the light source 500 unlike the case of FIG. 12, thereby minimizing a space in which the second surface US2 or the second region NCA of the heat dissipation sheet 300 is exposed.

A backlight unit 10_11 of FIG. 23 includes a light blocking film 150_11 in which an opening 150P_11 having a hexagonal planar shape is formed. The light blocking film 150_11 of FIG. 22 differs from the light blocking film 150_10 of FIG. 22 in that the opening 150P_11 also partially exposes a region other than the light source 500, thereby reducing the amount of light emitted from the light source 500 and incident on the light blocking film 150_11. When the opening 150P is disposed so as to overlap only the light source 500, the amount of light incident on the light blocking film 150 out of the light emitted from the light source 500 without directionality may increase. The light blocking film 150_11 of FIG. 23 includes the opening 150P_11 which also partially exposes a region adjacent to the light source 500, thereby increasing a region where light is emitted.

A backlight unit 10_12 of FIG. 24 includes a light blocking film 150_12 in which an opening 150P_12 having a rounded shape is formed. Accordingly, it is possible to increase a region where the light blocking film 150_12 covers the source electrode 123' and the drain electrode 124 of the transistor 120. The source electrode 123 and the drain electrode 124 including a conductive material may reflect light incident on the first substrate 100 from the outside. The light blocking film 150_12 may be disposed to prevent light from being incident on the active layer 126 of the transistor 120 and to reduce external light reflection by the source electrode 123 and the drain electrode 124.

The opening 150P_12 of the light blocking film 150_12 may be disposed to overlap the light source 500, and the source electrode 123 and the drain electrode 124 may be formed such that the overlapping region is minimized. Accordingly, the light blocking film 150_12 can reduce the external light reflection by the source electrode 123 and the drain electrode 124 while increasing the region in which the light of the light source 500 is emitted through the opening 150P_12.

The light blocking film 150 may have a plurality of openings 150P formed in the second region NCA of the heat dissipation sheet 300 in which one light source 500 is disposed. In an exemplary embodiment, the plurality of openings 150P may have a slit shape extending in at least one direction.

Figure 25:
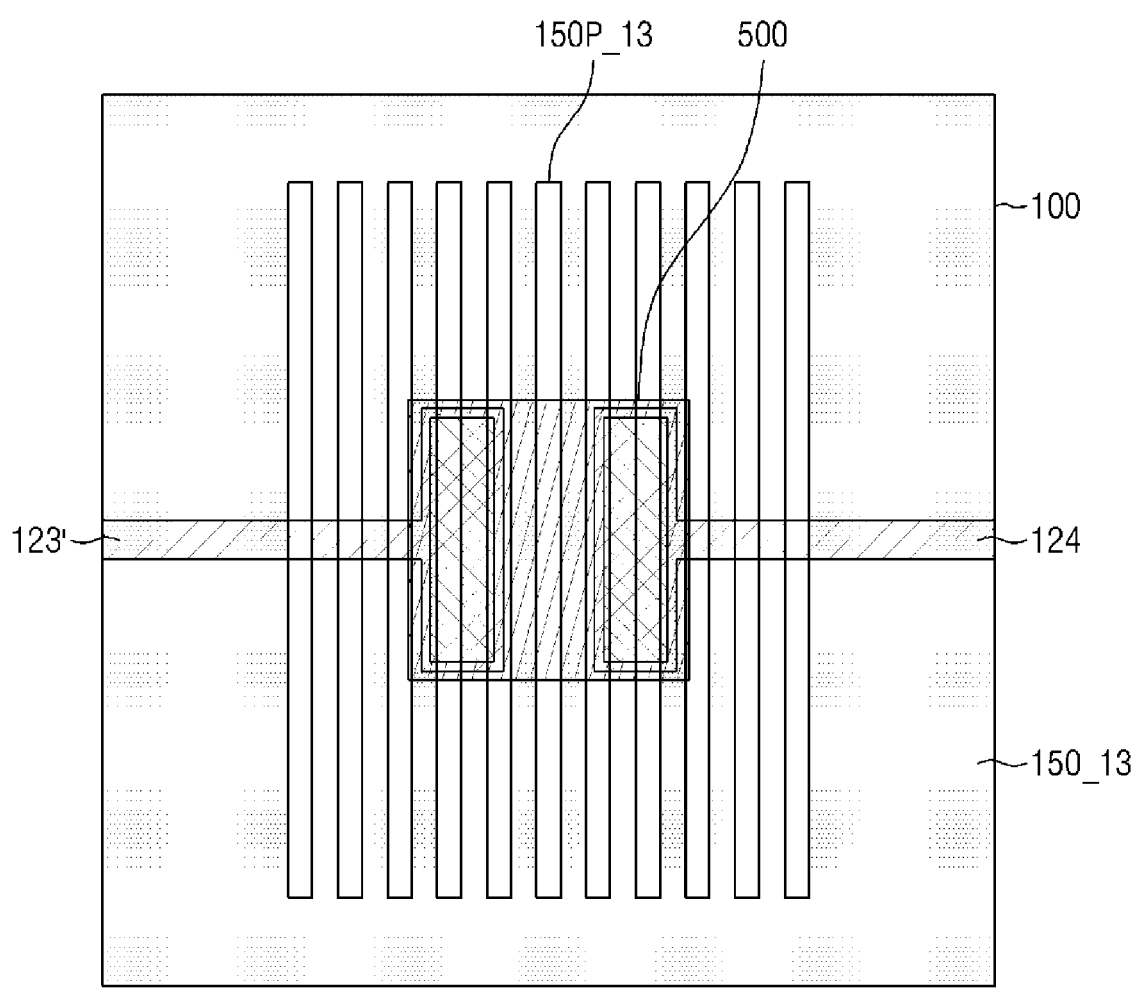

Referring to FIG. 25, a backlight unit 10_13 according to an exemplary embodiment may include a light blocking film 150_13 having a plurality of openings 150P_13 extending in one direction in the second region NCA in which one light source 500 is disposed. The plurality of openings 150P_13 may extend in one direction and may be separated from each other in a direction perpendicular to the extending direction. Some of the openings 150P_13 may partially overlap the light source 500 and some of the openings 150P_13 may not overlap the light source 500.

Figure 26:
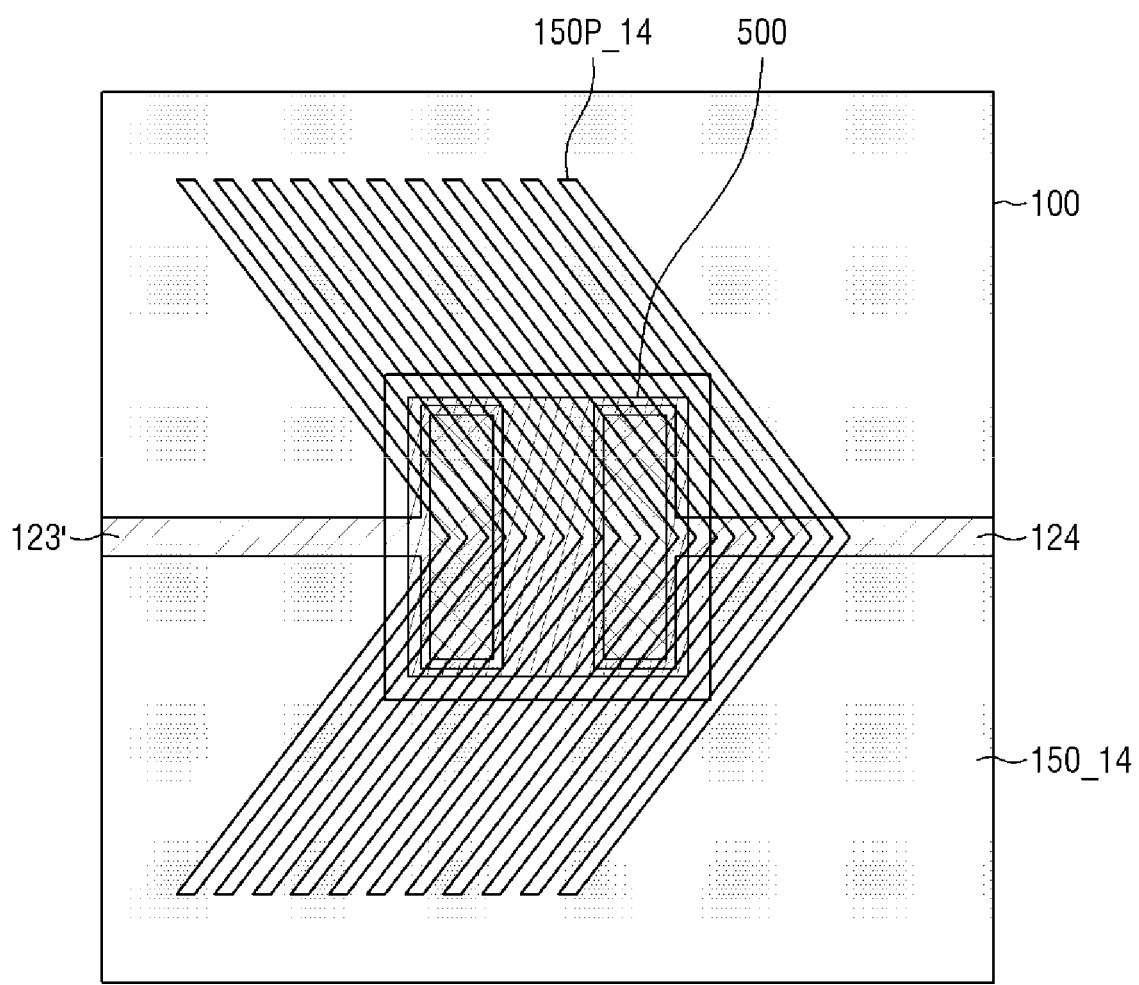
Figure 27:
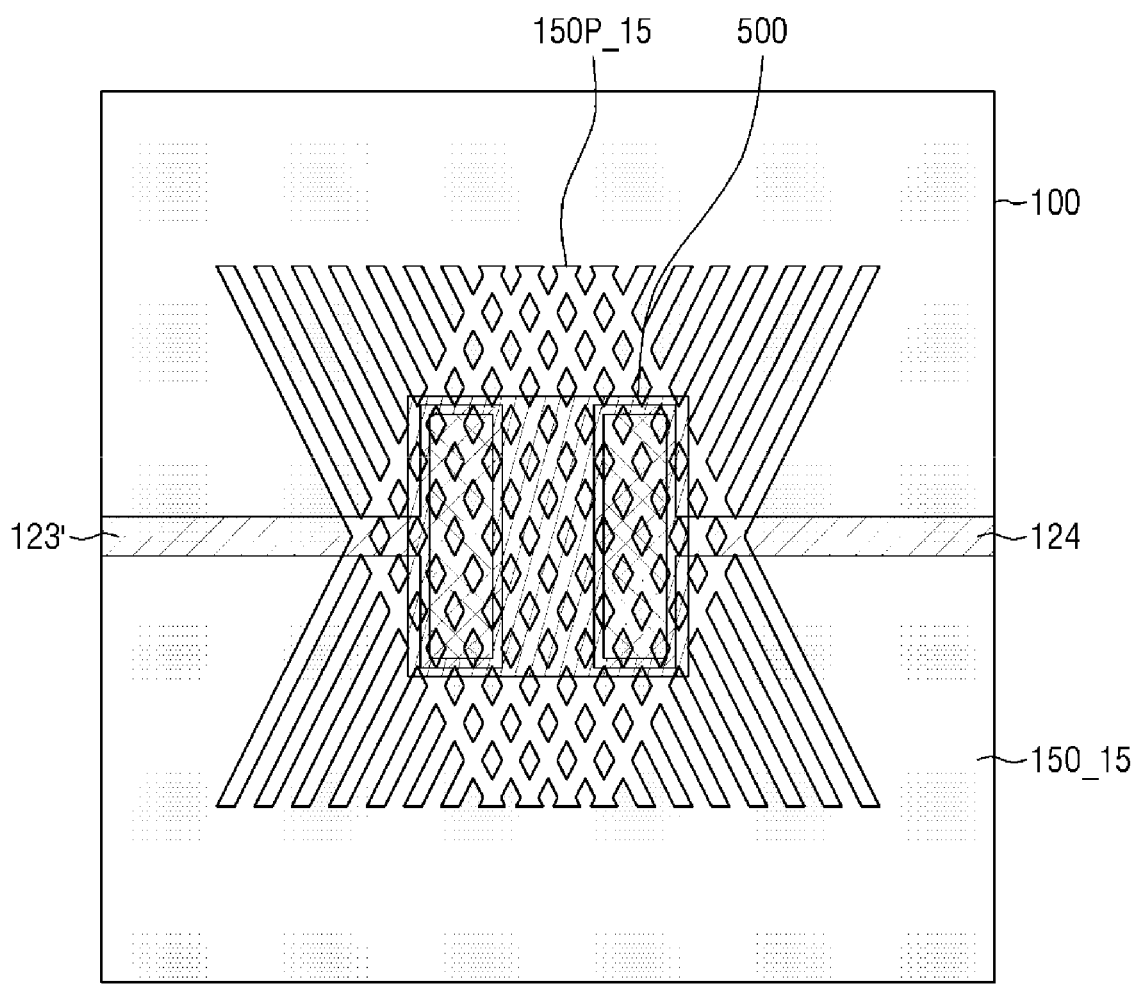

In a backlight unit 10_14 of FIG. 26, a plurality of openings 150P_14 may extend in one direction, and may have a bent shape in a partial region. The openings 150P_14 include a plurality of regions extending in an oblique direction, and the openings 150P_14 may be bent in a region where they meet. A backlight unit 10_15 of FIG. 27 may include an opening 150P_15 in which the openings 150P_14 of FIG. 26 are formed symmetrically with respect to the center of the light source 500. A detailed description thereof is the same as described above and thus will be omitted.

Figure 28:
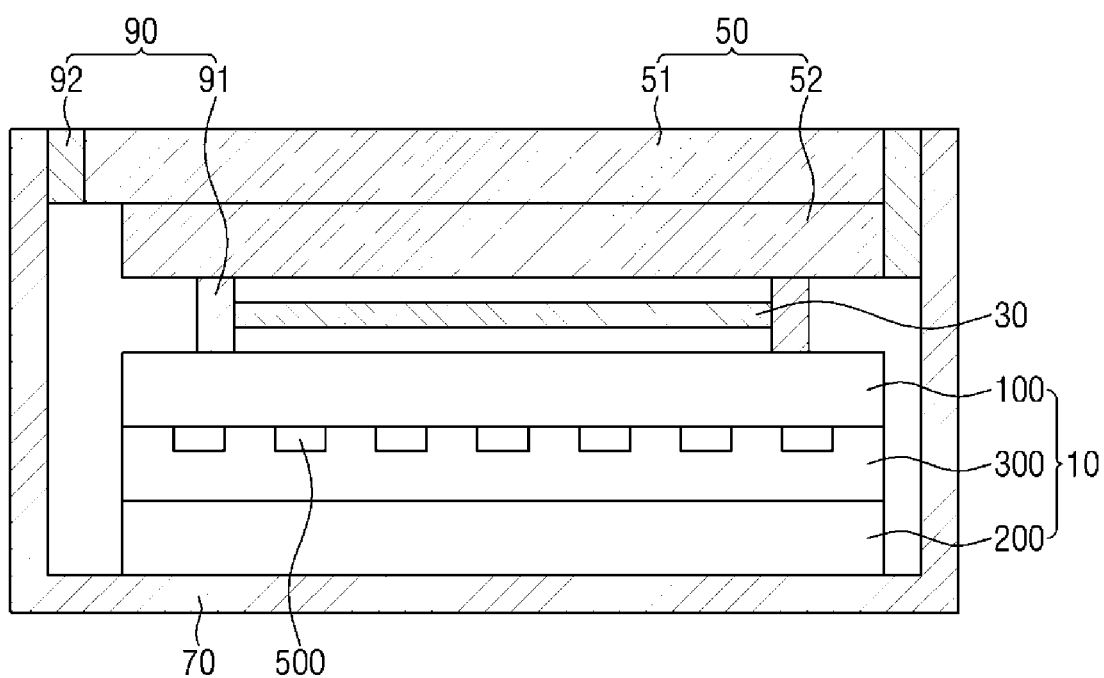
FIG. 28 is a schematic cross-sectional view of a display device according to an exemplary embodiment.

FIG. 28 is a schematic cross-sectional view of a display device according to an exemplary embodiment.

Referring to FIG. 28, a display device 1 includes the backlight unit 10 of FIG. 1 described above. In FIG. 28, only the schematic structure of the backlight unit 10 is illustrated, and a detailed description thereof is the same as described above.

The display device 1 according to an exemplary embodiment may include the backlight unit 10, a display panel 50, an optical film 30, a housing 70 and an adhesive member 90. However, the inventive concepts are not limited thereto, and the display device 1 may include one or more members other than the above-mentioned members. Alternatively, any one of the above-mentioned members may be omitted. A detailed description of the backlight unit 10 is the same as described above, and thus, will not be described below.

The display panel 50 is disposed on the backlight unit 10. The display panel 50 may display a screen by receiving the light emitted from the backlight unit 10. In an exemplary embodiment, the display panel 50 may be a liquid crystal display panel, a light receiving display panel, an electrophoretic panel, or the like. Hereinafter, a case where the display panel 50 is a liquid crystal panel (LCD) will be described as an example. However, it is obvious that the following description can be similarly applied even when the display panel 50 is of a different kind.

The display panel 50 may include an upper substrate 51, a lower substrate 52 facing the upper substrate 51, and a liquid crystal layer (not shown) disposed therebetween. The upper substrate 51 and the lower substrate 52 may overlap each other. In one exemplary embodiment, one of the substrates may be larger than the other substrate and may protrude further outward. FIG. 28 illustrates that the upper substrate 51 is larger and protrudes from one side of the lower substrate 52. Although not shown in the drawing, a region formed between the housing 70 and the backlight unit 10 by the protrusion of the upper substrate 51 may provide a space for mounting a driving chip or an external circuit board. However, the inventive concepts are not limited thereto.

The optical film 30 is disposed between the backlight unit 10 and the display panel 50. The display device 1 may include at least one optical film 30, and the number thereof is not particularly limited. Although FIG. 28 shows that the optical film 30 is disposed to be separated from the backlight unit 10 and the display panel 50, the inventive concepts are not limited thereto. In some cases, the optical film 30 may be disposed to be in contact with the backlight unit 10 and the display panel 50.

The optical film 30 may be a prism film, a diffusion film, a micro-lens film, a lenticular film, a polarizing film, a reflective polarizing film, a retardation film, or the like. The display device 1 may include a plurality of optical films 30 of the same kind or different kinds. When a plurality of optical films 30 are applied, the optical films 30 may be disposed to overlap each other or be separated from each other.

The optical films 30 and the display panel 50 may be attached or fixed by a plurality of adhesive members 90. The adhesive members 90 include first adhesive members 91 and second adhesive members 92. The first adhesive members 91 may adhere or fix the backlight unit 10 and the display panel 50 to each other, and the second adhesive members 92 may adhere or fix the display panel 50 and the housing 70 to each other. In an exemplary embodiment, the adhesive members 90 may include a polymer resin, an adhesive tape, or the like. Further, the adhesive members 90 may also function as a light transmission blocking pattern. For example, the adhesive members 90 may include a light absorbing material such as a black pigment or dye, or may include a reflective material to perform a light transmission blocking function. However, the inventive concepts are not limited thereto.

The first adhesive members 91 may be disposed between the backlight unit 10 and the display panel 50 to perform a function of adhering or fixing them. In this case, the optical film 30 may be disposed between the first adhesive members 91. The adhesive members 90 may be adhered to the adhesion or fixation target members at the edge portions thereof. For example, the first adhesive members 90 may be disposed between the backlight unit 10 and the display panel 50 to fix them, and may be disposed so as to surround the border of the optical film 30 to fix the optical film 30.

The second adhesive members 92 may be disposed at the edge portion of the display panel 50. It is illustrated in the drawing that the second adhesive members 92 are disposed at the border of the upper substrate 51 and one side edge of the lower substrate 52 of the display panel 50. The second adhesive member 92 may attach or fix the display panel 50 to the housing 70. However, the inventive concepts are not limited thereto.

The housing 70 may provide a space in which the above-described members are disposed. One surface of the housing 70 may be opened and the display panel 50 may be disposed on the open surface. The backlight unit 10 and the optical film 30 may be disposed in an internal space of the housing 70.

Exemplary embodiments of the invention provide a backlight unit including a heat dissipation sheet contacting or surrounding a light source and a circuit element layer. The heat dissipation sheet includes a material having high thermal conductivity to smoothly transfer heat generated by the light source and the circuit element layer. Accordingly, the backlight unit can smoothly discharge the heat generated by the light source and the circuit element layer through the heat dissipation sheet.

Thus, according to the inventive concepts, it is possible to provide a display device including the backlight unit with improved heat dissipation efficiency.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A backlight unit comprising:
   a first substrate on which at least one transistor is disposed;
   a second substrate facing the first substrate;
   a heat dissipation sheet disposed on the second substrate, wherein at least a part of the heat dissipation sheet is in contact with the first substrate; and
   at least one light source disposed between the heat dissipation sheet and the first substrate and electrically connected to the transistor,
   wherein the heat dissipation sheet includes a first region in contact with the first substrate and a second region separated from the first substrate, the second region being a region other than the first region.

2. The backlight unit of claim 1, wherein:
   an upper surface of the heat dissipation sheet has a first surface located in the first region and a second surface located in the second region and recessed to be separated from the first substrate; and
   the transistor is disposed to contact with the first surface, and the light source is disposed between the second surface and the first substrate.

3. The backlight unit of claim 2, wherein thermal conductivity of the heat dissipation sheet has a larger value than thermal conductivity of the first substrate, and heat generated by the light source and the transistor is transferred to the heat dissipation sheet.

4. The backlight unit of claim 2, wherein the second surface has a curved shape at least in a partial region thereof.

5. The backlight unit of claim 2, wherein the second surface includes an inclined surface formed in at least a partial region thereof, and a flat surface substantially parallel to the first substrate.

6. The backlight unit of claim 2, wherein at least a partial region of the second surface is in contact with a region of the light source facing the heat dissipation sheet.

7. The backlight unit of claim 2, wherein at least a portion of light emitted from the light source travels toward the first substrate.

8. The backlight unit of claim 7, further comprising a reflective layer disposed between the light source and the second surface,
   wherein at least a portion of the light emitted from the light source travels toward the reflective layer.

9. The backlight unit of claim 7, wherein the first substrate further includes a light blocking film disposed between the transistor and the first substrate, and the light blocking film includes at least one opening disposed such that at least a part thereof overlaps the light source.

10. The backlight unit of claim 9, wherein at least a portion of the light emitted from the light source travels to the first substrate through the opening.

11. The backlight unit of claim 2, further comprising an optical sheet disposed between the light source and the first substrate.

12. The backlight unit of claim 11, wherein a refractive index of the optical sheet has a value between a refractive index of the light source and a refractive index of the first substrate.

13. The backlight unit of claim 12, wherein the optical sheet further includes wavelength conversion particles which convert a central wavelength band of light incident from the light source.

14. A backlight unit comprising:
   a glass substrate on which a circuit element layer including at least one transistor is mounted;
   a heat dissipation substrate facing the glass substrate, wherein at least a part the heat dissipation substrate is in contact with the glass substrate; and
   at least one light emitting diode disposed on the circuit element layer and electrically connected to the transistor,
   wherein the heat dissipation substrate includes a first region in contact with the glass substrate and a second region separated from the glass substrate, the second region being a region other than the first region.

15. The backlight unit of claim 14, wherein thermal conductivity of the heat dissipation substrate is larger than thermal conductivity of the glass substrate.

16. The backlight unit of claim 15, wherein the transistor overlaps the first region and is in contact with the heat dissipation substrate, and the light emitting diode overlaps the second region and is disposed between the glass substrate and the heat dissipation substrate.

17. The backlight unit of claim 16, wherein at least a partial region of the heat dissipation substrate is in contact with the light emitting diode.

18. A display device comprising:
a backlight unit; and
a display panel disposed above the backlight unit, wherein:
the backlight unit comprises:
   a first substrate;
   a second substrate facing the first substrate;
   a heat dissipation sheet disposed on the second substrate, wherein at least a part of the heat dissipation sheet is in contact with the first substrate; and
   at least one light source disposed between the heat dissipation sheet and the first substrate;
the heat dissipation sheet includes a first region in contact with the first substrate and a second region separated from the first substrate, the second region being a region other than the first region; and
the light source is disposed in the second region in which the heat dissipation sheet and the first substrate are separated from each other.

19. The display device of claim 18, wherein thermal conductivity of the heat dissipation sheet is larger than thermal conductivity of the first substrate.

20. The display device of claim 19, wherein the first substrate further includes a circuit element layer containing at least one transistor, and the transistor is disposed in contact with the heat dissipation sheet in the first region.

* * * * *